United States Patent
Hata et al.

(10) Patent No.: US 8,698,315 B2
(45) Date of Patent: Apr. 15, 2014

(54) SEMICONDUCTOR DEVICE

(75) Inventors: Yoshiyuki Hata, Nagoya (JP); Yutaka Nonomura, Nagoya (JP); Teruhisa Akashi, Nagoya (JP); Hirofumi Funabashi, Nagoya (JP); Motohiro Fujiyoshi, Seto (JP); Yoshiteru Omura, Seto (JP)

(73) Assignee: Kabushiki Kaisha Toyota Chuo Kenkyusho, Nagakute-Shi (JP)

( * ) Notice: Subject to any disclaimer, the term of this patent is extended or adjusted under 35 U.S.C. 154(b) by 81 days.

(21) Appl. No.: 13/596,859

(22) Filed: Aug. 28, 2012

(65) Prior Publication Data
US 2013/0049212 A1    Feb. 28, 2013

(30) Foreign Application Priority Data

Aug. 30, 2011 (JP) ................................. 2011-187680
May 29, 2012 (JP) ................................. 2012-122267

(51) Int. Cl.
*H01L 23/48* (2006.01)
*H01L 23/52* (2006.01)
*H01L 29/40* (2006.01)

(52) U.S. Cl.
USPC ...... 257/773; 257/E23.07; 257/416; 257/775; 438/618; 438/666

(58) Field of Classification Search
USPC ............ 257/E23.07, 296, 390, 416, 773–775; 438/585, 618, 666, 669, 781
See application file for complete search history.

(56) References Cited

U.S. PATENT DOCUMENTS

| 6,351,057 | B1   | 2/2002  | Kim |
| 6,953,753 | B2 * | 10/2005 | Oohara et al. ................ 438/719 |
| 7,342,316 | B2 * | 3/2008  | Booth et al. .................. 257/773 |
| 8,198,698 | B2 * | 6/2012  | Maeda et al. ................. 257/499 |

(Continued)

FOREIGN PATENT DOCUMENTS

| JP | A-8-90431    | 4/1996 |
| JP | A-2000-211136 | 8/2000 |

(Continued)

OTHER PUBLICATIONS

Amini et al., "Sub-Micro-Gravity Capacitive Soi Microaccelerometers," *The 13th International Conference on Solid-State Sensors, Actuators and Microsystems*, Seoul, Korea, Jun. 5-9, 2005, pp. 515-518.

*Primary Examiner* — Chris Chu
(74) *Attorney, Agent, or Firm* — Oliff PLC

(57) ABSTRACT

When forming a trench of a narrow width in a thick semiconductor layer, a trench can be formed without the occurrence of semiconductor residue. In this Specification, a semiconductor device in which a trench is formed in a semiconductor layer is disclosed. In the semiconductor layer of the semiconductor device, a compensation pattern which compensates for sudden changes in the width of the trench is formed at a place at which the width of the trench changes suddenly. In the semiconductor layer of the above-described semiconductor device, since a compensation pattern is formed at a place at which the trench width changes suddenly, in the case where forming the trench using a deep RIE method, the occurrence of steep inclined portions arising from semiconductor residue can be prevented. Consequently, when forming a trench of a narrow width in a thick semiconductor layer, the occurrence of semiconductor residue can be prevented.

10 Claims, 24 Drawing Sheets

(56) References Cited

U.S. PATENT DOCUMENTS

| | | | |
|---|---|---|---|
| 8,375,786 B2* | 2/2013 | Neul | 73/504.12 |
| 2002/0172872 A1* | 11/2002 | Hoshino | 430/5 |
| 2003/0176071 A1* | 9/2003 | Oohara et al. | 438/707 |
| 2003/0227063 A1* | 12/2003 | Sel et al. | 257/390 |
| 2004/0109120 A1* | 6/2004 | Lee et al. | 349/141 |
| 2004/0159941 A1* | 8/2004 | Yoshikuni | 257/734 |
| 2004/0243967 A1* | 12/2004 | Yamagiwa et al. | 716/19 |
| 2005/0147896 A1* | 7/2005 | Hoshino | 430/5 |
| 2005/0236928 A1 | 10/2005 | Kurozuka et al. | |
| 2006/0124972 A1* | 6/2006 | Booth et al. | 257/222 |
| 2007/0155188 A1* | 7/2007 | Kamijima | 438/781 |
| 2010/0058864 A1* | 3/2010 | Hsu et al. | 73/514.32 |
| 2011/0256484 A1* | 10/2011 | Asai et al. | 430/319 |
| 2012/0169955 A1* | 7/2012 | Kim et al. | 349/41 |
| 2012/0223375 A1* | 9/2012 | Maeda et al. | 257/296 |

FOREIGN PATENT DOCUMENTS

| | | |
|---|---|---|
| JP | A-2005-341788 | 12/2005 |
| JP | A-2006-201519 | 8/2006 |
| JP | A-2008-224525 | 9/2008 |
| JP | A-2010-161179 | 7/2010 |

* cited by examiner

US 8,698,315 B2

SEMICONDUCTOR DEVICE

CROSS-REFERENCE TO RELATED APPLICATIONS

This application claims priority to Japanese Patent Application No. 2011-187680 filed on Aug. 30, 2011, and Japanese Patent Application No. 2012-122267 filed on May 29, 2012, the contents of which are hereby incorporated by reference into the present application.

TECHNICAL FIELD

The present application relates to a semiconductor device, in particular, relates to a semiconductor device in which a narrow trench is formed in a thick semiconductor layer.

DESCRIPTION OF RELATED ART

A semiconductor device provided with a support substrate and a movable structure is disclosed in B. Vakili Amini et al, "Sub-Micro-Gravity Capacitive SOI Microaccelerometers", (Proc. Int. Conf. Solid-State Sensors, Actuators and Microsystems (Transducers '05), 2005, pp. 515-518). In this semiconductor device, a comb-shaped fixed electrode in a fixed position relative to the support substrate, and a comb-shaped movable electrode fixed in a position relative to the movable structure, are formed in a semiconductor layer. The fixed electrode and the movable electrode are disposed in mutual opposition, and electrostatic capacitance is formed according to the opposing area and distance between the two. In this semiconductor device, by making the thickness of the semiconductor layer 120 μm and the width of the trench between the fixed electrode and the movable electrode approximately 10 μm, changes in electrostatic capacitance can be detected with high sensitivity.

SUMMARY OF INVENTION

The present application discloses a semiconductor device. The semiconductor device comprises a semiconductor layer having a first trench having a first width and a second trench having a second width different from the first width and connected with the first trench. In the semiconductor device, a compensation pattern for gradually compensating a difference between the first width and the second width, is formed at a place of contact between the first trench and the second trench.

DETAILED DESCRIPTION OF INVENTION

In order to form a comb-shaped fixed electrode and a movable electrode in mutual opposition at a distance of approximately 10 μm to 20 μm on a semiconductor layer thicker than the semiconductor device according to Vakili Amini et al, for example, on a semiconductor layer of thickness approximately 200 μm to 400 μm, a technique to precisely form a trench with high aspect ratio is indispensable. However, from research by the inventors of this application, it has been found that if an attempt is made to form a narrow trench in such a thick semiconductor layer, semiconductor residue tends to occur.

Figure 18:
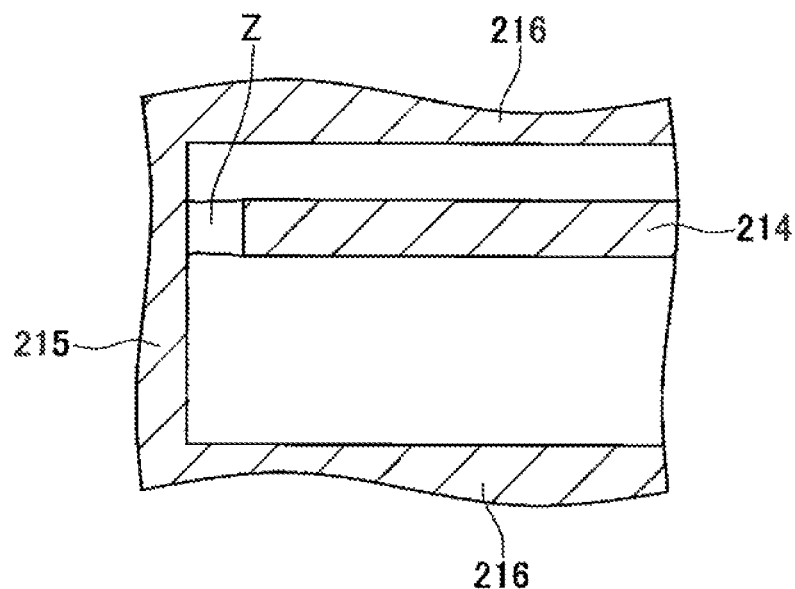
FIG. 18 shows the manner of occurrence of semiconductor residue Z in the prior art.

FIG. 18 shows the manner of occurrence of residue Z of the semiconductor in proximity to the tip portion of the fixed electrode 214, when a comb-shaped movable electrode 216 extending from a movable electrode support portion 215 and a comb-shaped fixed electrode 214 disposed in opposition to the movable electrode 216 are formed in a semiconductor layer consisting of single-crystal silicon. In this example, the thickness of the semiconductor layer is approximately 200 μm to 400 μm. Further, the distance of the fixed electrode 214 from the movable electrode 216 disposed in proximity (the movable electrode 216 positioned upward in FIG. 18 as seen from the fixed electrode 214) is approximately 10 μm to 20 μm, and the distance of the fixed electrode 214 from the movable electrode 216 disposed remotely (the movable electrode 216 positioned downward in FIG. 18 as seen from the fixed electrode 214) is approximately 40 μm to 50 μm, and the distance to the movable electrode support portion 215 opposing the tip portion is approximately 10 μm to 20 μm. If a deep RIE method is used to form a trench in the semiconductor layer to form the above-described shape, precise formation is possible at places where the depth from the surface of the semiconductor layer is shallow, but at places where the depth from the surface is deep, residue Z of the semiconductor occurs between the tip portion of the fixed electrode 214 and the movable electrode support portion 215, as shown in FIG. 18.

Figure 19:
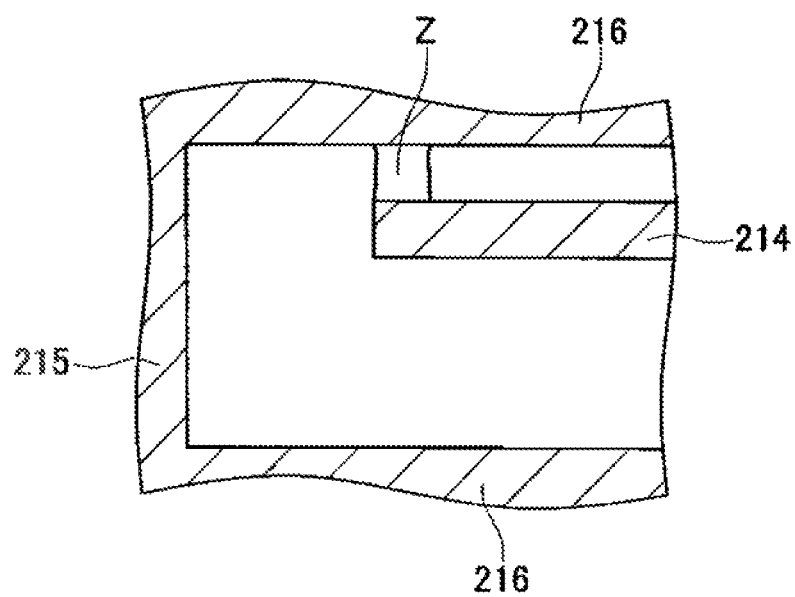
FIG. 19 shows the manner of occurrence of semiconductor residue Z in the prior art.

Further, as shown in FIG. 19, when the distance between the tip portion of the fixed electrode 214 and the movable electrode support portion 215 is broadened to approximately 40 μm to 50 μm, such that the above-described residue Z of the semiconductor does not occur, at places where the depth from the surface of the semiconductor layer is deep, residue Z of the semiconductor occurs between the tip portion of the fixed electrode 214 and the movable electrode 216.

When residue Z of the semiconductor occurs as described above, the fixed electrode 214 and movable electrode 216 can no longer be formed with complete separation. Hence the semiconductor device can no longer be used as a sensor to detect changes in electrostatic capacitance.

The above-described occurrence of semiconductor residue in trench formation is a problem not only when forming comb-shaped movable electrodes and fixed electrodes disposed in mutual opposition, but also when attempting to form a trench of narrow width in a thick semiconductor layer.

In this application, a technique to resolve the above-described problem is presented. In this application, a technique is presented which enables formation of a trench without the occurrence of semiconductor residue, even when forming a trench of narrow width in a thick semiconductor layer.

As a result of research by the inventors, the occurrence of semiconductor residue, occurring at places where the trench width changes suddenly when a trench of narrow width is formed in a thick semiconductor layer, was identified. Below, the mechanism of occurrence of semiconductor residue is explained.

Figure 20:
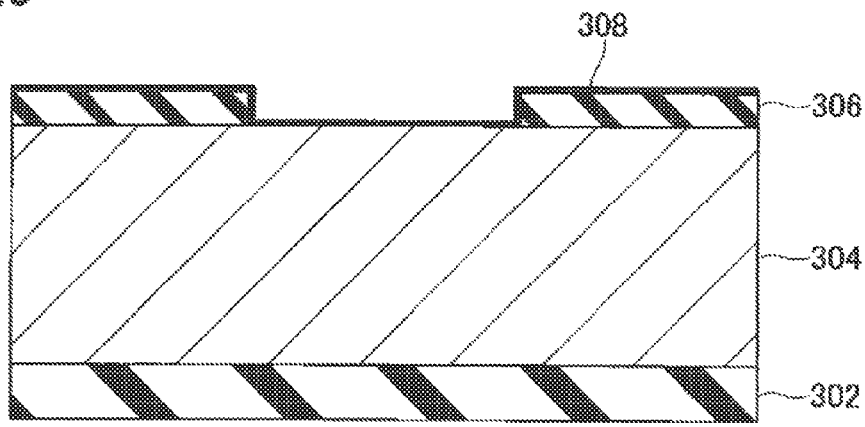
FIG. 20 shows the manner of trench formation using the Bosch process.
Figure 21:
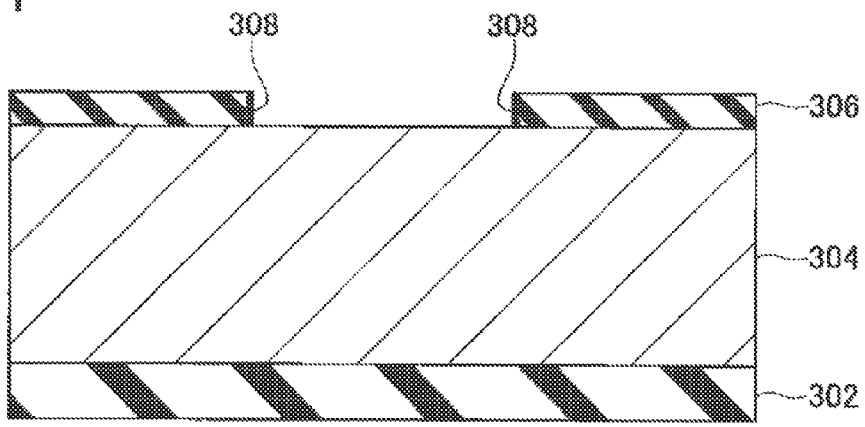
FIG. 21 shows the manner of trench formation using the Bosch process.
Figure 22:
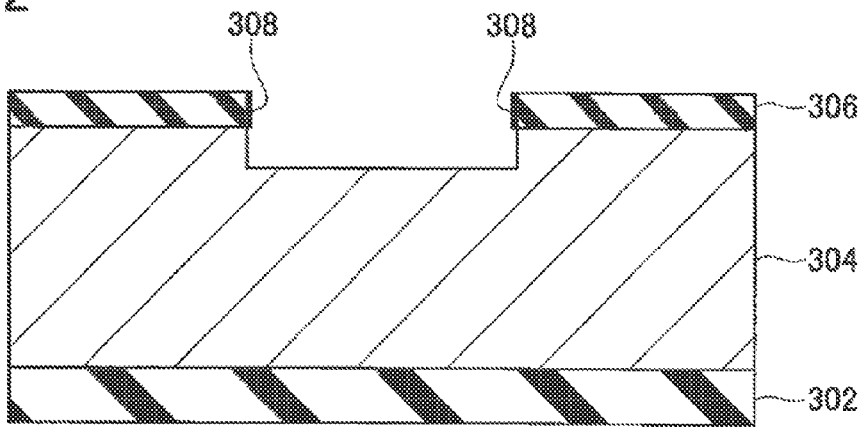
FIG. 22 shows the manner of trench formation using the Bosch process.
Figure 23:
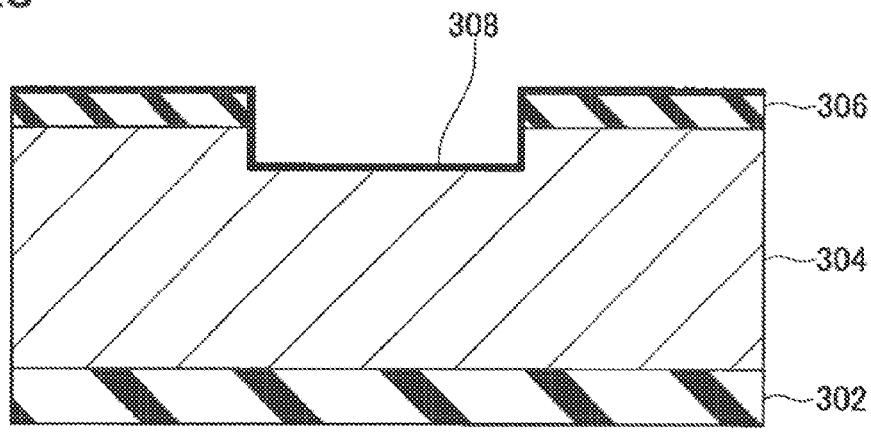
FIG. 23 shows the manner of trench formation using the Bosch process.
Figure 24:
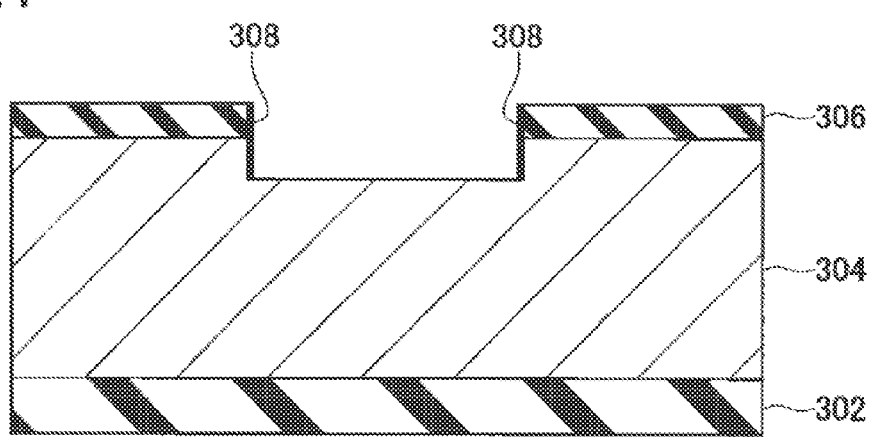
FIG. 24 shows the manner of trench formation using the Bosch process.
Figure 25:
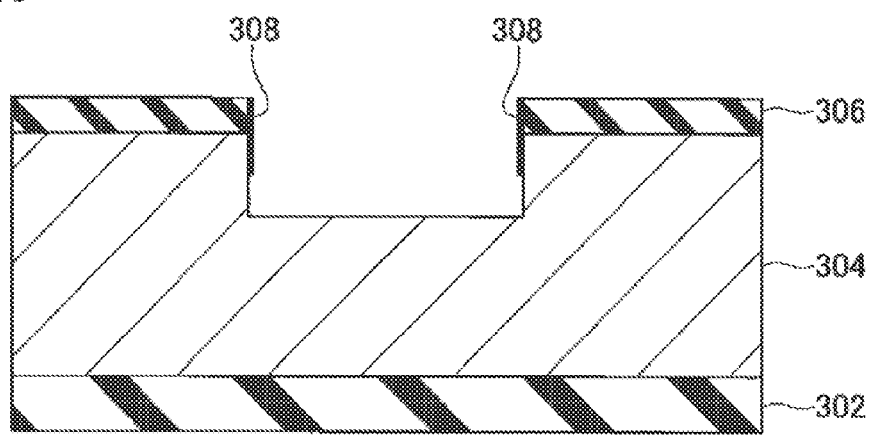
FIG. 25 shows the manner of trench formation using the Bosch process.

Normally, when a trench of narrow width is formed in a thick semiconductor layer, the Bosch process, which is one type of deep RIE method, is used. FIG. 20 to FIG. 25 show details of trench formation by the Bosch process. In the Bosch process, as shown in FIG. 20, first $C_4F_8$ plasma is used to deposit a protective film 308 from the surface side of the semiconductor layer 304, on which a mask 306 has been formed. Then, as shown in FIG. 21, $SF_6$ plasma is used to remove the protective film 308 formed on surfaces other than the side walls. Then, as shown in FIG. 22, $SF_6$ plasma is used to etch the semiconductor layer 304. Thereafter, as shown in FIG. 23, a protective film 308 is again deposited from the surface side of the semiconductor layer 304. And, as shown in FIG. 24, the protective film 308 formed on surfaces other than the side walls is removed. And, as shown in FIG. 25, the semiconductor layer 304 is etched. Thus in the Bosch process, deposition of the protective film 308 on side walls and etching of the semiconductor layer 304 are repeated, to excavate deeply into the semiconductor layer 304. In the example of FIG. 20 to FIG. 25, the oxide film layer 302 stacked below the semiconductor layer 304 functions as an etch-stopping material in etching of the semiconductor layer 304.

Figure 26:
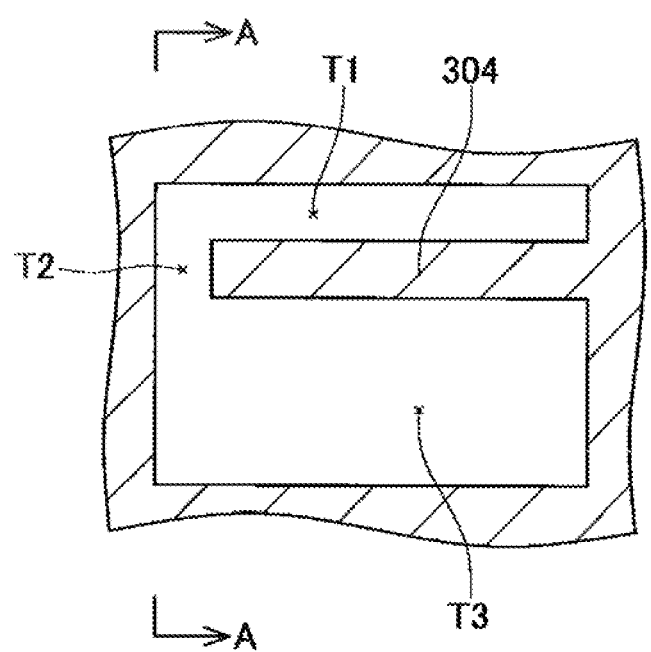
FIG. 26 shows a mechanism of occurrence of semiconductor residue Z in the prior art.

FIG. 26 to FIG. 30 show the results of studies by the inventors of the mechanism by which semiconductor residue is generated in places at which the trench width suddenly changes, in trench formation using a deep RIE method. As shown in FIG. 26, a case is explained in which a shape surrounded by trenches T1, T2, T3 on three sides is formed in a semiconductor layer 304. Here, the thickness of the semiconductor layer is approximately 200 μm to 400 μm, the width of the trench T1 is approximately 10 μm to 20 μm, the width of the trench T2 is approximately 10 μm to 20 μm, and the width of the trench T3 is approximately 40 μm to 50 μm. In the oblique views of FIG. 27 to FIG. 30, in order to elucidate the explanation, the A-A cross-section in FIG. 26 is shown on the left side in the front.

Figure 27:
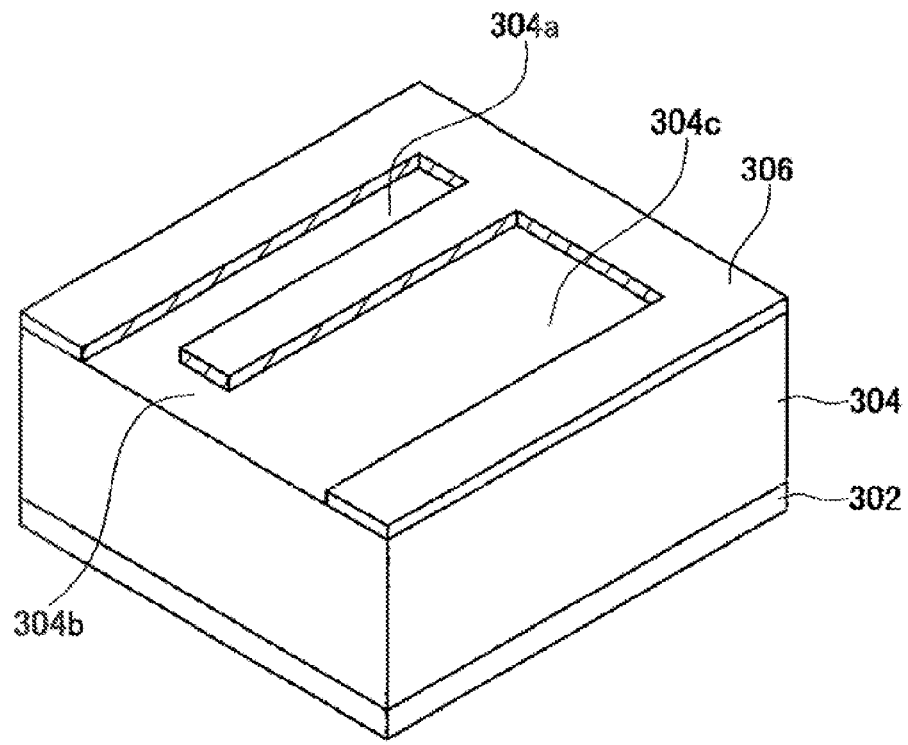
FIG. 27 shows a mechanism of occurrence of semiconductor residue Z in the prior art.
Figure 28:
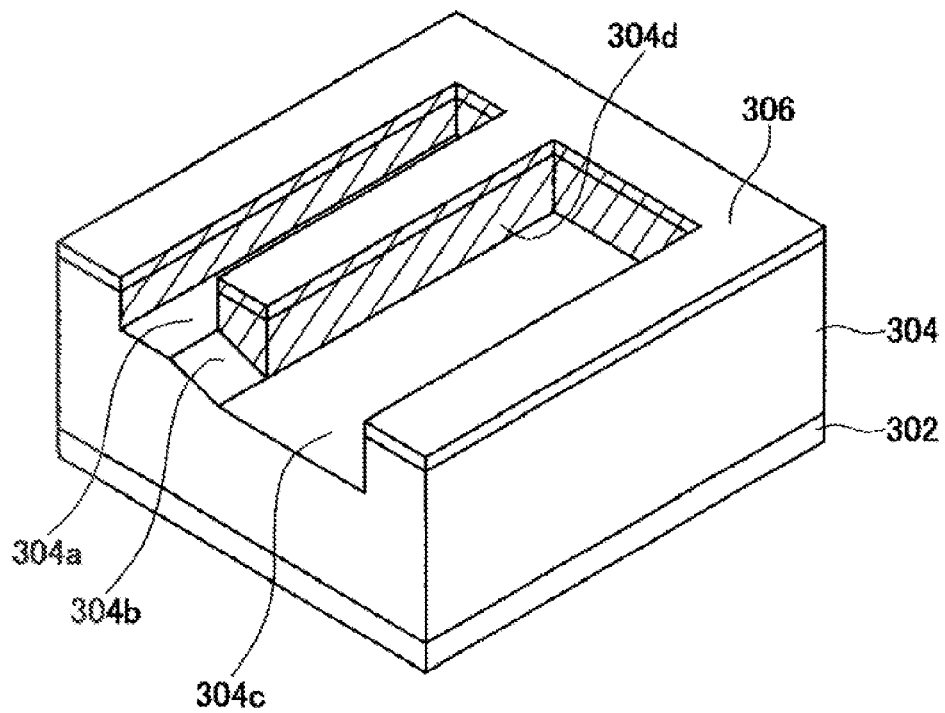
FIG. 28 shows a mechanism of occurrence of semiconductor residue Z in the prior art.
Figure 29:
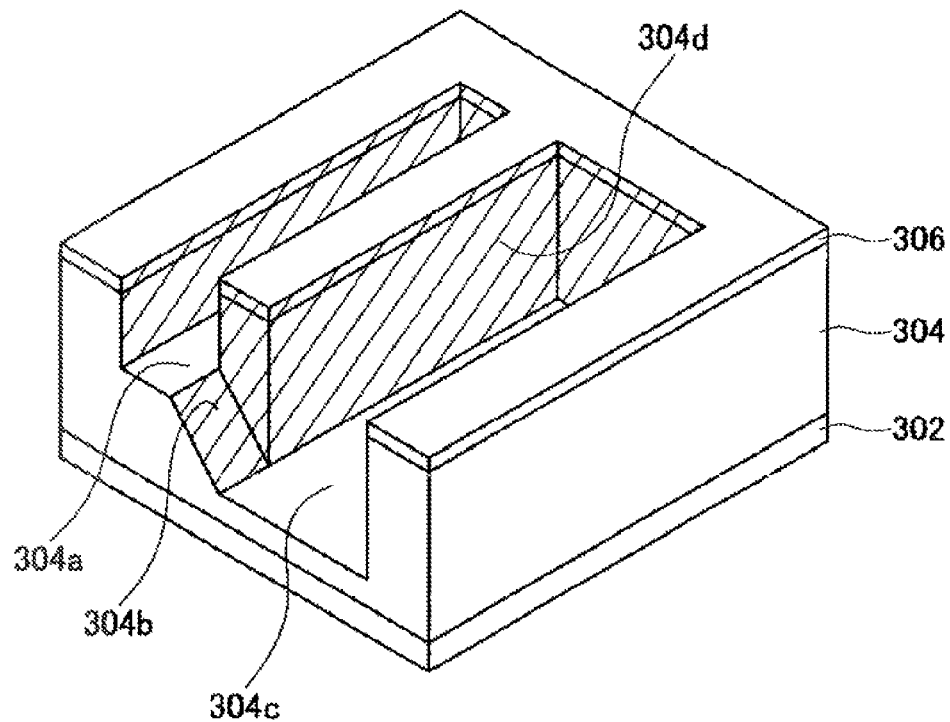
FIG. 29 shows a mechanism of occurrence of semiconductor residue Z in the prior art.
Figure 30:
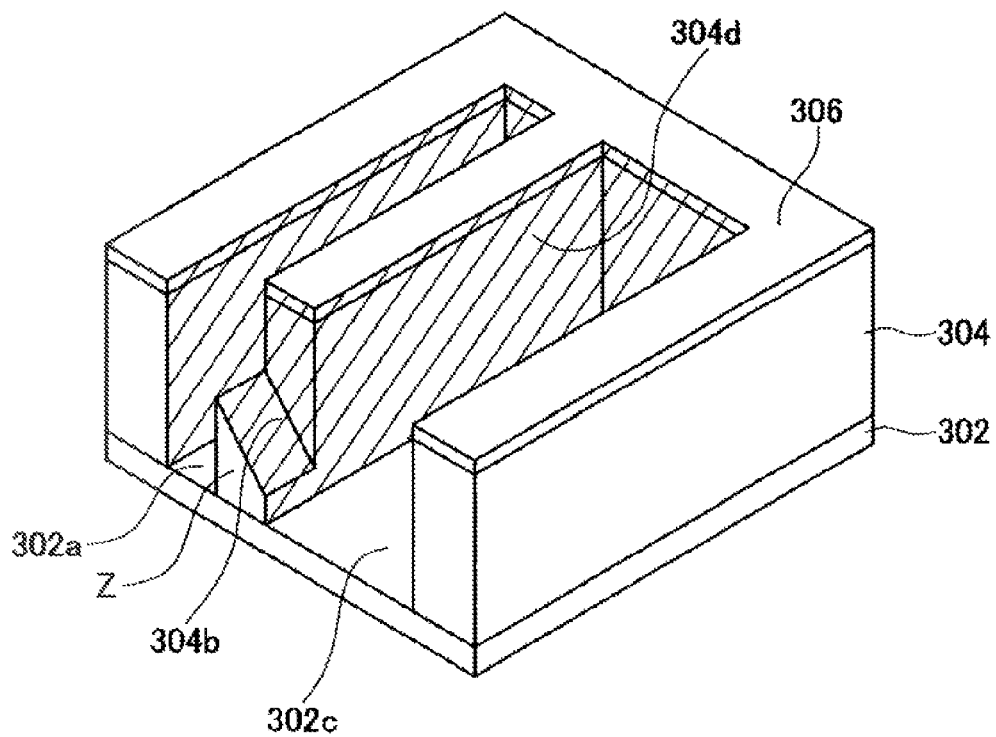
FIG. 30 shows a mechanism of occurrence of semiconductor residue Z in the prior art.

When trenches with the shapes shown in FIG. 26 are formed in the semiconductor layer 304, after forming a mask 306 on the surface of the semiconductor layer 304 stacked on an oxide film layer 302 as shown in FIG. 27, the Bosch process is used to excavate the trenches. At this time, a difference occurs in the etch rates at the place 304a corresponding to the narrow trench T1 and at the place 304c corresponding to the wide trench T3, due to the difference in gas replacement properties. Consequently even when etching is performed for the same time, height differences occur in the place 304a corresponding, to the narrow trench T1 and the place 304c corresponding to the wide trench T3, as shown in FIG. 28. As a result, at the place 304b at which the trench width changes suddenly, an inclined portion is formed. When the Bosch process is further continued, the height difference between the place 304a corresponding to the narrow trench T1 and the place 304c corresponding to the wide trench T3 becomes still greater, as shown in FIG. 29, and the inclined portion at the place 304b where the trench width changes suddenly becomes steeper. As a result, the protective film which normally would be deposited only on the side walls 304d comes to be deposited on the steep inclined portion at the place 304b where the trench width changes suddenly, and further etching of the semiconductor layer directly below the inclined portion becomes difficult. Thereafter the Bosch process is further continued, and as shown in FIG. 30, so that even though etching of the place corresponding to the wide trench T3 reaches the oxidation film layer 302c and etching of the place corresponding to the narrow trench T1 reaches the oxidation film layer 302a, residue Z of the semiconductor remains at the place 304b at which the trench width changes suddenly.

Based on the above knowledge, the inventors conceived a structure to prevent the occurrence of semiconductor residue when forming a pattern connecting a narrow-width trench and a wide-width trench in a thick semiconductor layer. In this Specification, a semiconductor device in which a trench is formed in a semiconductor layer is disclosed. In this semiconductor device, a compensation pattern is formed in the semiconductor layer at places where the width of the trench changes suddenly, to compensate for sudden changes in the trench width.

In the above-described semiconductor device, sudden changes in the trench width are compensated by a compensation pattern, and thus when forming a trench using a deep RIE method, the occurrence of sharp inclined portions causing semiconductor residue can be prevented. Consequently, when forming a pattern in which a narrow trench and a wide trench are connected in a thick semiconductor layer, the occurrence of semiconductor residue can be prevented.

In the above-described semiconductor device, it is preferable that a tip portion surrounded on three sides by the trenches be formed in the semiconductor layer, that the trench width change suddenly in the vicinity of the tip portion, and that the compensation pattern be formed at the tip portion.

When a semiconductor layer has a tip portion surrounded by trenches on three sides, a compensation pattern to compensate for sudden changes in trench width may be formed at the tip portion, or may be formed at a place opposing the tip portion. However, when a compensation pattern is formed at the tip portion, the sudden change in trench width can be compensated by a small compensation pattern, and the occurrence of semiconductor residue can be prevented. A compensation pattern is formed to compensate for sudden changes in trench width, but also influences the mechanical characteristics and electrical characteristics of the semiconductor device. It is preferable that such influences be small. Through the above-described semiconductor device, by forming a compensation pattern, the influence imparted to the mechanical characteristics and electrical characteristics of the semiconductor device can be made small.

It is preferable that the above-described semiconductor device comprise a support substrate and a movable structure; that the semiconductor layer comprise a comb-shaped fixed electrode fixed at a position relative to the support substrate, and a comb-shaped movable electrode fixed at a position relative to the movable structure; that the fixed electrode and the movable electrode be disposed to face each other; and that the compensation pattern be formed at a tip portion of the fixed electrode and/or the movable electrode.

In a semiconductor device comprising a support substrate and a movable structure as described above, in order to broaden the area of opposition of the comb-shaped fixed electrode and movable electrode and shorten the distance between the fixed electrode and the movable electrode, it is desirable that the semiconductor layer be made thick and the trench widths be made narrow. However, in such a comb-shaped fixed electrode and movable electrode, if the semiconductor layer is made thick and the trench widths are made narrow, semiconductor residue readily occurs at portions at which the trench width changes suddenly. Through the above-described semiconductor device, even when the semiconductor layer is made thick and the trench widths are made narrow in the comb-shaped fixed electrode and movable electrode, the occurrence of semiconductor residue can be prevented.

Or, in the above-described semiconductor device, a tip portion surrounded by the trenches on three sides may be formed in the semiconductor layer, with a sudden change in the trench widths in proximity to the tip portion, and the compensation pattern may be formed at a place opposing the tip portion.

In the above-described semiconductor device, a support substrate and a movable structure may be comprised, a comb-shaped fixed electrode fixed in a position relative to the support substrate and a comb-shaped movable electrode fixed in a position relative to the movable structure may be comprised on the semiconductor layer, with the fixed electrode and the movable electrode disposed to face each other, and the compensation pattern may be formed at the place opposing the tip portions of the fixed electrode and/or the movable electrode.

In the above-described semiconductor device, it is preferable that the thickness of the semiconductor layer be 200 µm or greater, and that the ratio of the depth of the trenches to the smallest width of the trenches be 20 or greater.

As a result of research by the inventors, when the thickness of the semiconductor layer is 200 µm or greater, and the ratio of the trench depth to the smallest width of the trenches is 20 or greater, residue readily occurs at places where the trench width changes suddenly. Through the above-described semiconductor device, it is possible to prevent the occurrence of semiconductor residue even in semiconductor devices with shapes requiting trench formation with such a high aspect ratio in a semiconductor layer.

Using the technique disclosed in this application, when forming a narrow trench in a thick semiconductor layer, the trench can be formed without the occurrence of semiconductor residue.

Features of preferred examples are listed.

(Feature 1) A semiconductor layer consists of single-crystal silicon with impurities added.

(Feature 2) Below the semiconductor layer is stacked an oxidation film layer consisting of silicon oxide.

(Feature 3) A trench in the semiconductor layer is formed by a deep RIE method.

Example 1

Below, the structure of the accelerometer 10 of Example 1 is explained, referring to FIG. 1 to FIG. 3. As shown in FIG. 2 and FIG. 3, the accelerometer 10 has a stacked structure of a first layer 20 consisting of a semiconductor, a second layer 30 consisting of an insulator, and a third layer 40 consisting a conductor. Specifically, in the accelerometer 10 of this example, the first layer 20 consists of single-crystal silicon with impurities added, the second layer 30 consists of silicon oxide, and the third layer 40 consists of single-crystal silicon with impurities added, in a so-called silicon on insulator (SOI) structure. In the accelerometer 10 of this example, the third layer 40 has a thickness of approximately 200 µm to 400 µm.

Figure 1:
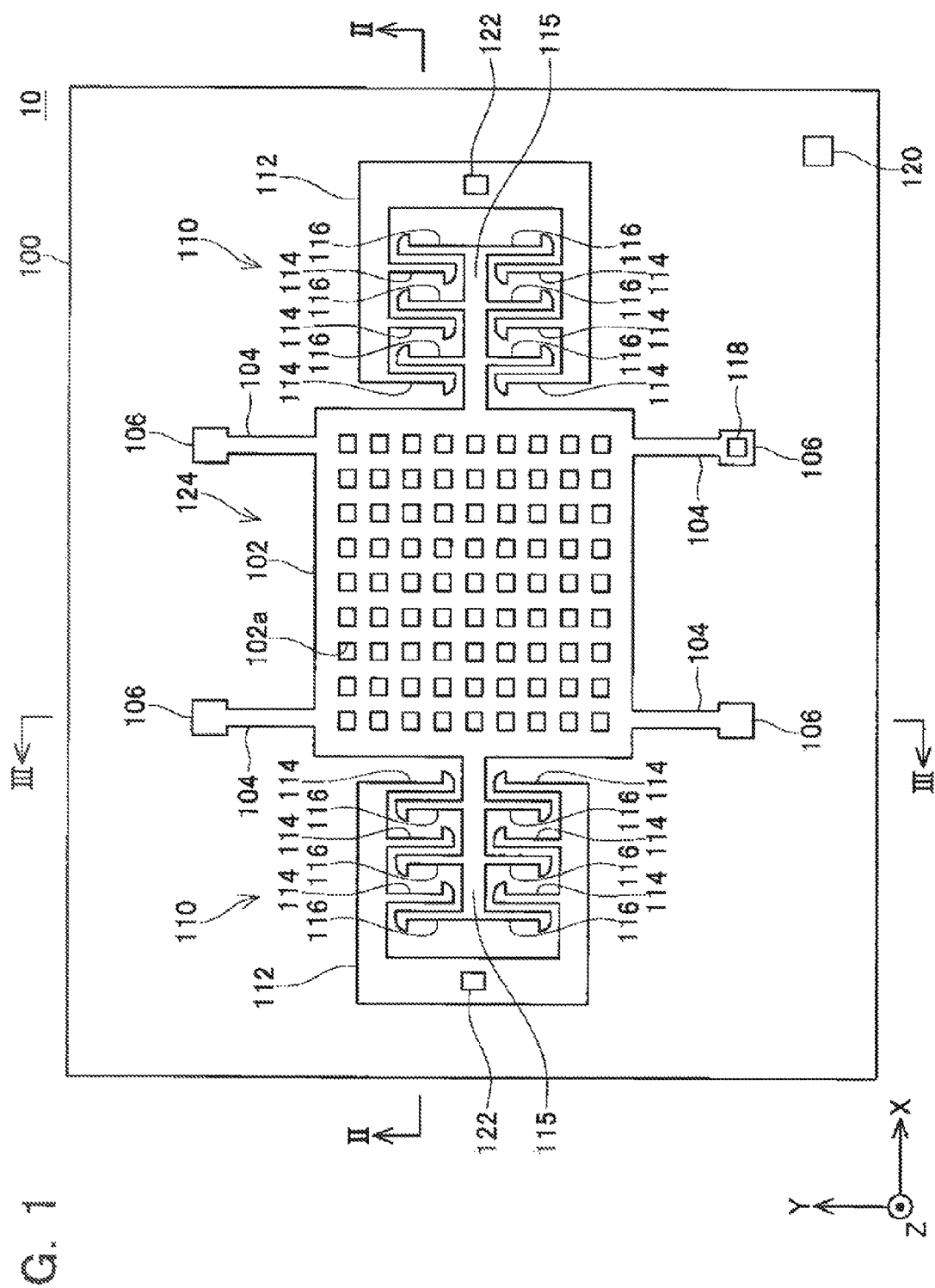
FIG. 1 shows a plane view of an accelerometer 10 in Example 1.
Figure 2:
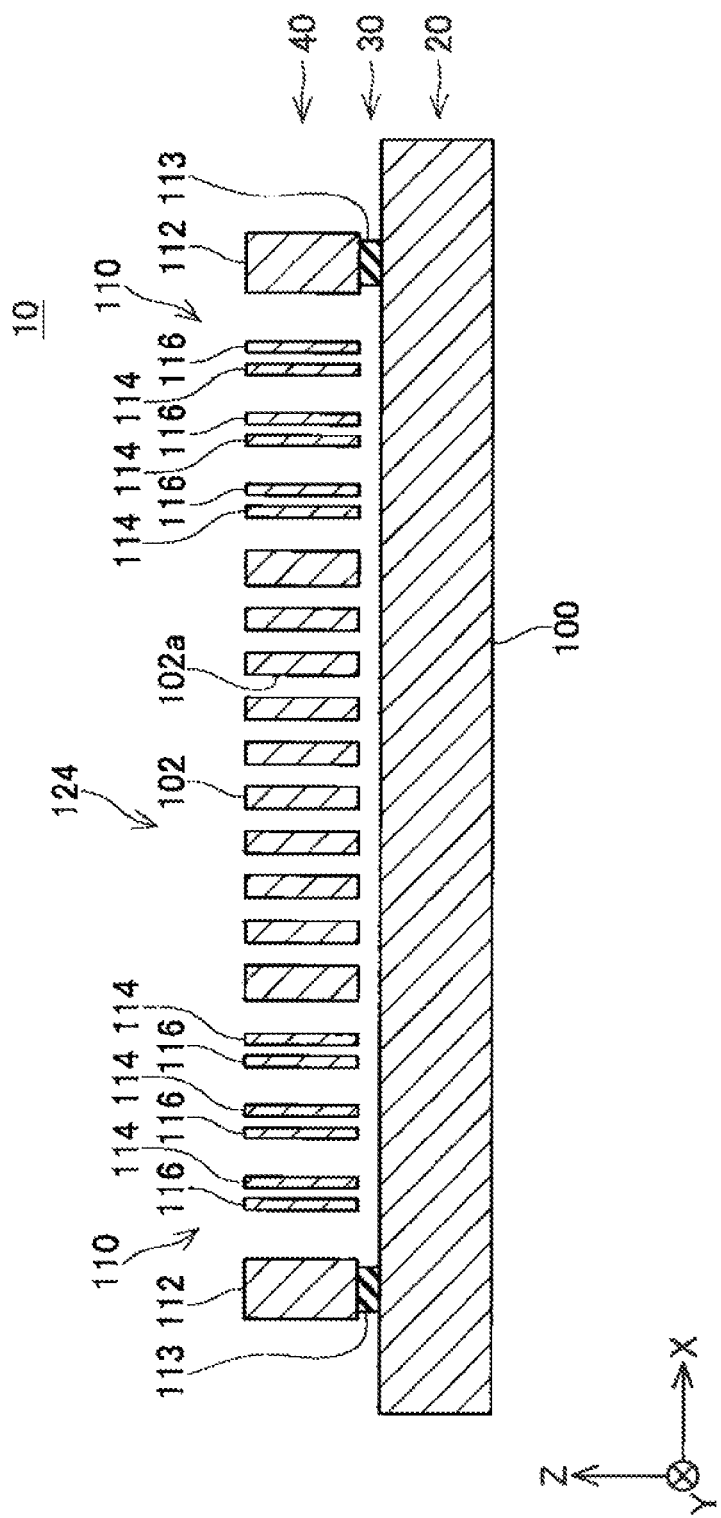
FIG. 2 shows a longitudinal cross-sectional view of the cross-section II-II in FIG. 1 of the accelerometer 10 in Example 1.
Figure 3:
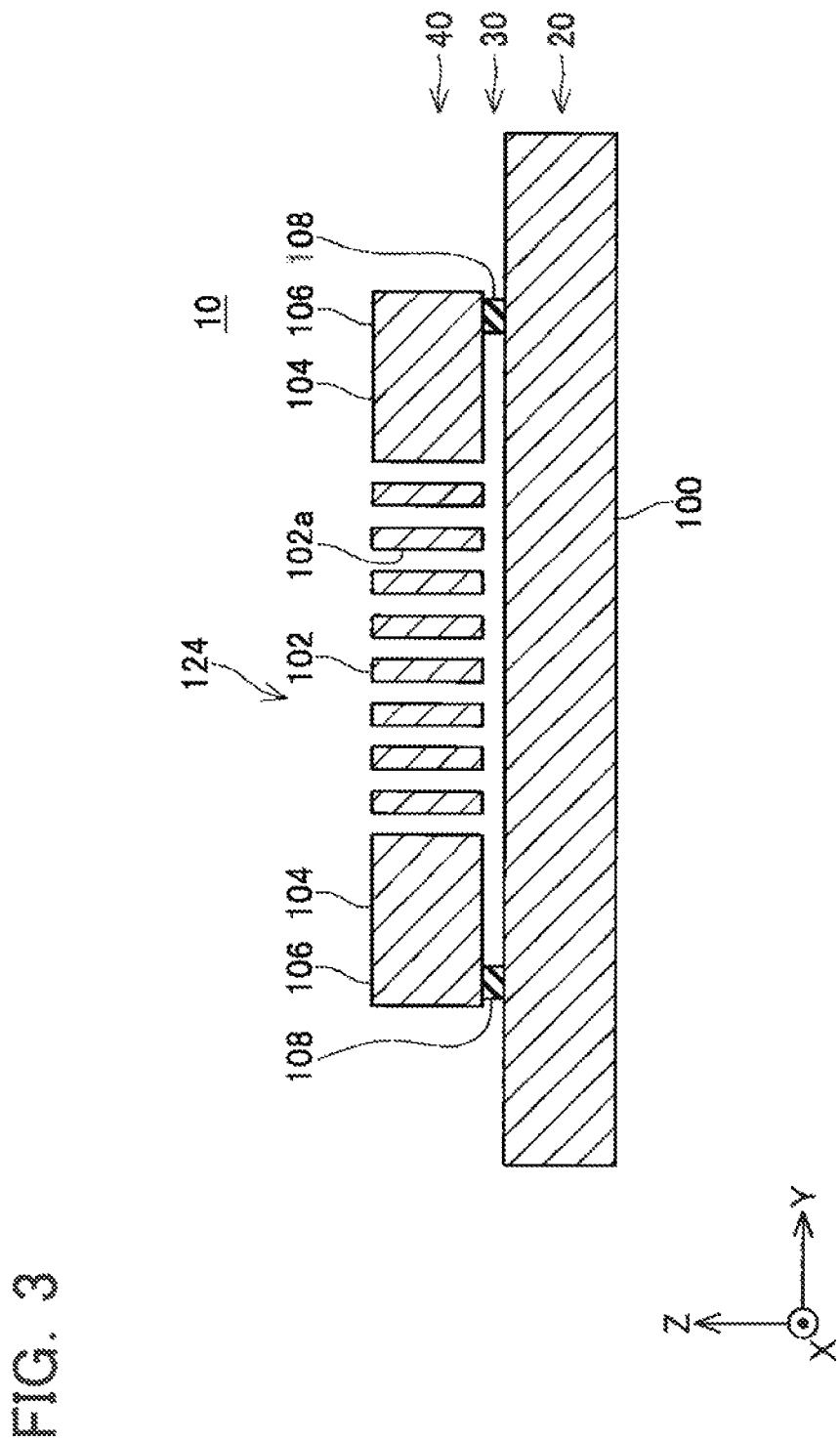
FIG. 3 shows a longitudinal cross-sectional view of the cross-section III-III in FIG. 1 of the accelerometer 10 in Example 1.

As shown in FIG. 1 to FIG. 3, the accelerometer 10 comprises a support substrate 100, a proof mass 102, support beams 104, and support portions 106. The support substrate 100 is formed in the first layer 20. The proof mass 102, support beams 104 and support portions 106 are formed in the third layer 40. The support portions 106 are fixed to the support substrate 100 via insulating support portions 108 formed on the second layer 30. The support beams 104 are connected between the support portions 106 and the proof mass 102. The proof mass 102 is formed in a flat rectangular shape. Numerous holes 102a for sacrificial layer etching are formed in the proof mass 102. The proof mass 102 is supported by the support beams 104 so as to be separated by a gap from the support substrate 100, and so as to be substantially parallel to the support substrate 100. The support beams 104 are formed in long narrow shapes such that bending stiffness and shear stiffness in the X direction and Z direction are low. Hence when an inertial force acts on the proof mass 102 in the X direction, for example, the support beams 104 bend in the X direction, and the proof mass 102 is displaced in the X direction relative to the support substrate 100. Further, when an inertial force acts on the proof mass 102 in the Z direction, the support beams 104 bend in the Z direction, and the proof mass 102 is displaced in the Z direction relative to the support substrate 100. At this time, the amount of deflection of the support beams 104 is an amount corresponding to the magnitude of the inertial force acting on the proof mass 102. In other words, the amount of displacement of the proof mass 102 relative to the support substrate 100 corresponds to the magnitude of the acceleration acting on the proof mass 102. Hence by detecting the amount of displacement of the proof mass 102 relative to the support substrate 100, the acceleration acting on the accelerometer 10 can be detected.

The accelerometer 10 comprises an X-direction detection portion 110 and a Z-direction detection portion 124. The X-direction detection portion 110 comprises a fixed electrode support portion 112, comb-shaped fixed electrodes 114 extending from the fixed electrode support portion 112, a movable electrode support portion 115 extending from the proof mass 102, and comb-shaped movable electrodes 116 extending from the movable electrode support portion 115. The fixed electrode support portion 112, fixed electrodes 114, movable electrode support portion 115 and movable electrodes 116 are formed in the third layer 40. The fixed electrode support portion 112 is fixed to the support substrate 100 via an insulating support portion 113 formed in the second layer 30. The fixed electrodes 114 and movable electrodes 116 are disposed in mutual opposition in the X direction. In this example, the distance between the fixed electrodes 114 and the movable electrodes 116 in mutual proximity is approximately 10 µm to 20 µm. An electrostatic capacitance is formed between the fixed electrodes 114 and the movable electrodes 116, according to the opposing area and distance between the two. When the movable electrodes 116 are displaced in the X direction relative to the fixed electrodes 114, the X-direction distance between the fixed electrodes 114 and the movable electrodes 116 changes, and the magnitude of the electrostatic capacitance between the fixed electrodes 114 and the movable electrodes 116 changes accordingly. By detecting this change in electrostatic capacitance, the amount of displacement in the X direction of the proof mass 102 relative to the support substrate 100 can be detected. In the accelerometer 10 of this example, by combining the outputs of the X-direction detection portion 110 disposed on one side of the proof mass 102 (for example the right side in FIG. 1) and the X-direction detection portion 110 disposed on the other side (for example the left side in FIG. 1), capacitance errors arising from manufacturing tolerances and similar can be corrected.

As shown in FIG. 2 and FIG. 3, the Z-direction detection portion 124 comprises the support substrate 100 which serves as a fixed electrode, and the proof mass 102 which serves as a movable electrode. An electrostatic capacitance is formed between the support substrate 100 and the proof mass 102 according to the opposing area and distance between the two. When the proof mass 102 is displaced in the Z direction relative to the support substrate 100, the magnitude of the electrostatic capacitance between the support substrate 100 and the proof mass 102 changes. By detecting this change in electrostatic capacitance, the amount of Z-direction displacement of the proof mass 102 relative to the support substrate 100 can be detected.

In the accelerometer 10 of this example, the proof mass 102, support beams 104, support portions 106, movable electrode support portion 115 and movable electrodes 116 are formed seamlessly and integrally. Hence the proof mass 102, support beams 104, support portions 106, movable electrode support portion 115 and movable electrodes 116 are maintained at the same electrical potential. Further, in the accelerometer 10 of this example, the fixed electrode support portion 112 and the fixed electrodes 114 are formed seamlessly and integrally, and are maintained at the same electrical potential. As explained below, the proof mass 102, support beams 104, support portions 106, movable electrode support portion 115, movable electrodes 116, fixed electrode support portion 112, and fixed electrodes 114 are formed by forming trenches in the third layer 40.

The accelerometer 10 comprises a first surface electrode 118 which detects the electric potential of the support portion 106 (which is also the electric potential of the proof mass 102 which is the movable electrode of the Z-direction detection portion 124, and which is also the electric potential of the movable electrodes 116 of the X-direction detection portion 110), a second surface electrode 120 which detects the electric potential of the support substrate 100 (that is, the electric potential of the fixed electrode of the Z-direction detection portion 124), and a third surface electrode 122 which detects the electric potential of the fixed electrode support portion 112 (that is, the electric potential of the fixed electrodes 114 of the X-direction detection portion 110). Based on the outputs from these surface electrodes, computation processing is performed by a computation circuit (not shown), and the accelerations in the X direction and Z direction acting on the accelerometer 10 can be detected respectively.

Figure 4:
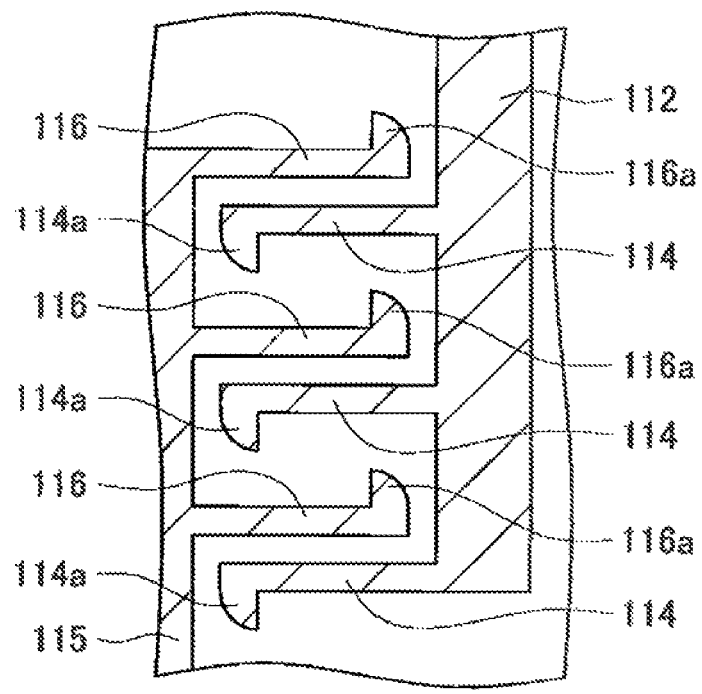
FIG. 4 shows a partial enlarged view of details of the X-direction detection portion 110 of the accelerometer 10 in Example 1.

As shown in FIG. 4, at the tip portions of the fixed electrodes 114, compensation patterns 114a are formed. A compensation pattern 114a is formed in a fan shape on the opposite-side face of the face opposing the movable electrode 116 disposed in proximity to the fixed electrode 114. In this example, the width of the trench formed along the movable electrode 116 disposed in proximity (the movable electrode 116 positioned on the upper side in FIG. 4) as seen from the fixed electrode 114 is approximately 10 µm to 20 µm. Further, the width of the trench formed along the movable electrode 116 positioned remotely (the movable electrode 116 positioned on the lower side in FIG. 4) as seen from the fixed electrode 114 is approximately 40 µm to 50 µm. Further, the width of the trench formed along the movable electrode support portion 115 as seen from the fixed electrode 114 is approximately 10 µm to 20 µm. If the compensation patterns 114a were not formed, the trench width would change suddenly from the trenches of width 10 µm to 20 µm to the trenches of width 40 µm to 50 µm in proximity to the tip portions of the fixed electrodes 114, and so silicon residue would occur during trench formation. However, in this example compensation patterns 114a are formed at the tip portions of the fixed electrodes 114, and thus sudden changes in trench width in proximity to the tip portions of the fixed electrodes 114 are suppressed. Through this configuration, the occurrence of silicon residue in proximity to the tip portions of the fixed electrodes 114 can be prevented.

Similarly, compensation patterns 116a which suppress sudden changes in trench width are formed at the tip portions of the movable electrodes 116. A compensation pattern 116a is formed in a fan shape on the opposite-side face of the face opposing the fixed electrode 114 disposed in proximity to the movable electrode 116. By forming such compensation patterns 116a, sudden changes in trench widths in proximity to the tip portions of the movable electrodes 116, such as from a width of 10 μm to 20 μm to a width of 40 μm to 50 μm, are suppressed. Through this configuration, the occurrence of silicon residue in proximity to the tip portions of the movable electrodes 116 can be prevented.

Below, a method of manufacture of the accelerometer 10 of this example is explained, referring to FIG. 5 to FIG. 11. FIG. 5 to FIG. 11 correspond to the cross-sectional plane II-II in FIG. 1, that is, the cross-section of FIG. 2.

Figure 5:
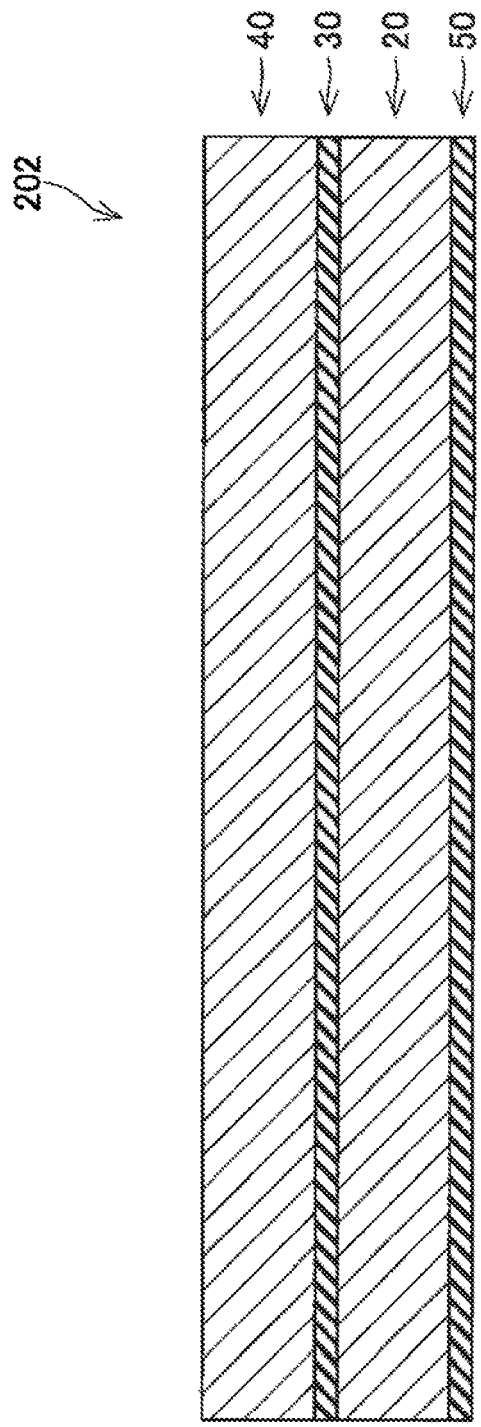
FIG. 5 shows a process to manufacture the accelerometer 10 in Example 1.

First, as shown in FIG. 5, a SOI wafer 202 is prepared having a stacked structure of a first layer 20 consisting of single-crystal silicon with impurities added, a second layer 30 consisting of silicon oxide, and a third layer 40 consisting of single-crystal silicon with impurities added. In the SOI wafer 202 of this example, a protective layer 50 consisting of silicon oxide is further stacked on the outside (the lower side in FIG. 5) of the first layer 20. The first layer 20 corresponds to the support substrate 100 of the manufactured accelerometer 10.

Next, a sputtering method and etching are used to form a first surface electrode 118, a second surface electrode 120, and a third surface electrode 122.

Figure 6:
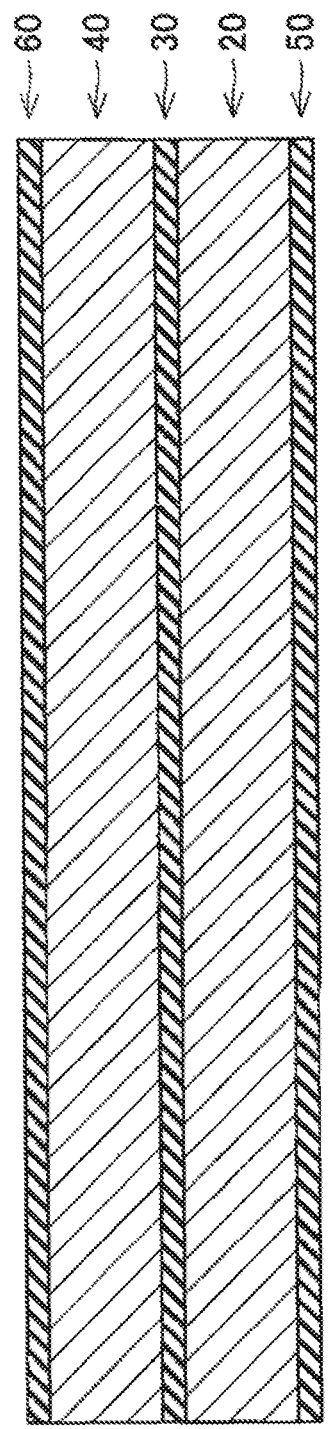
FIG. 6 shows a process to manufacture the accelerometer 10 in Example 1.

Next, as shown in FIG. 6, a fourth layer 60 consisting of silicon oxide is deposited on the surface of the third layer 40.

Figure 7:
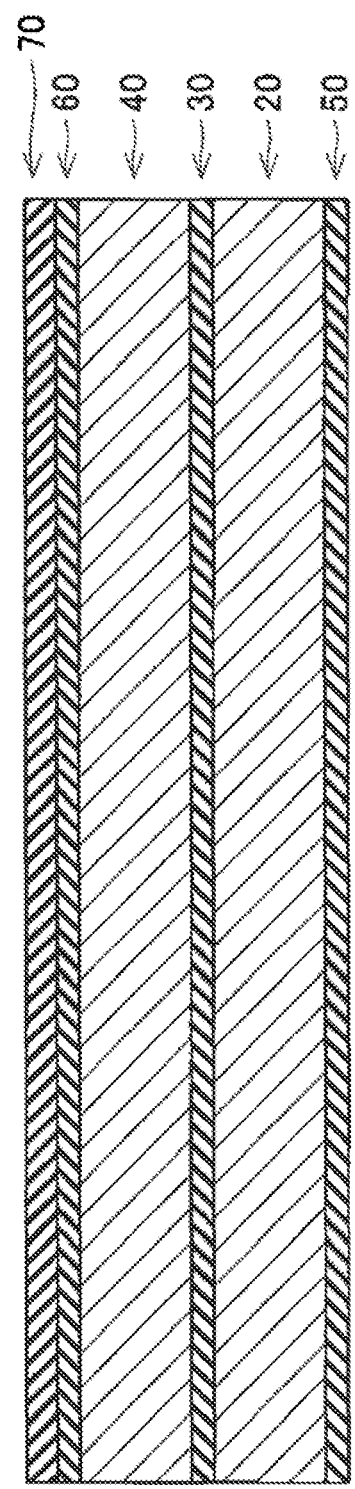
FIG. 7 shows a process to manufacture the accelerometer 10 in Example 1.

Next, as shown in FIG. 7, resist 70 is applied to the surface of the fourth layer 60.

Figure 8:
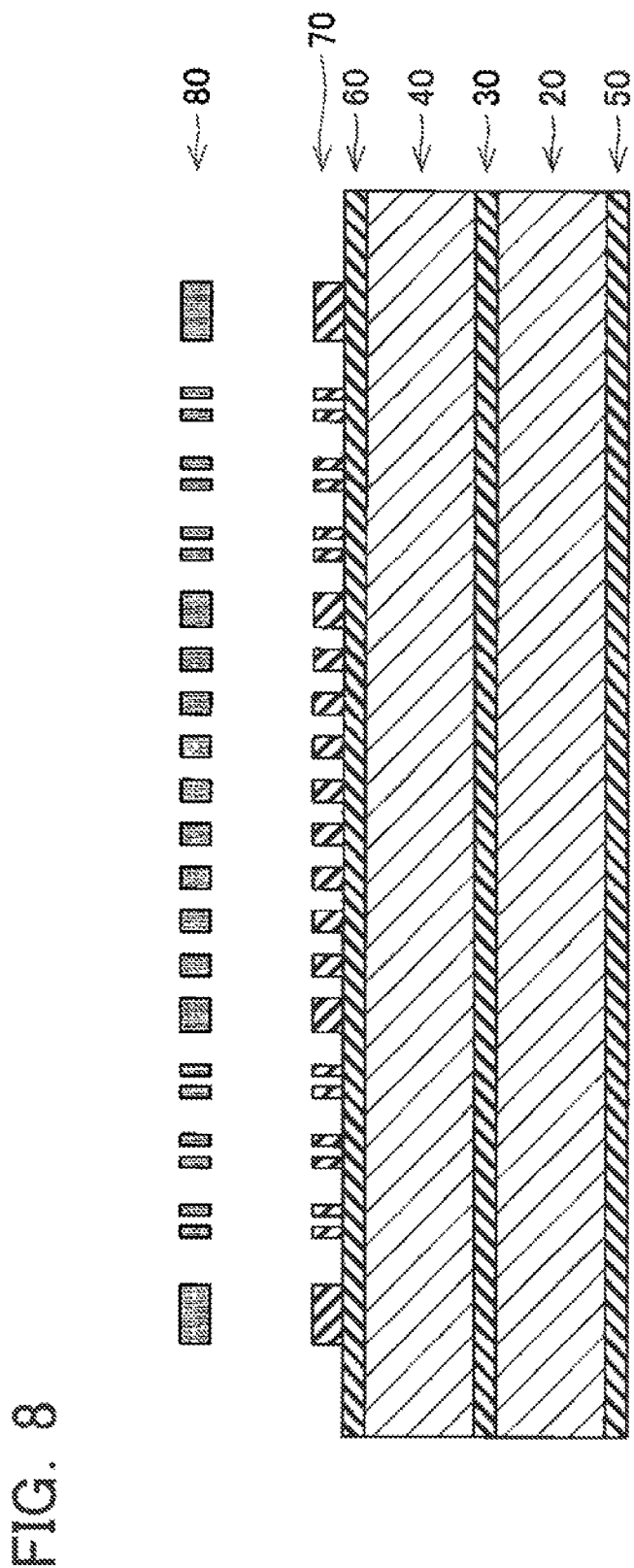
FIG. 8 shows a process to manufacture the accelerometer 10 in Example 1.

Next, as shown in FIG. 8, a photomask 80 is used in photolithography to pattern the resist 70. In the photomask 80 are formed the same patterns as the shapes in the third layer 40 in the accelerometer 10. Through this process, the shapes of the third layer 40 in the accelerometer 10 are transferred to the resist 70.

Figure 9:
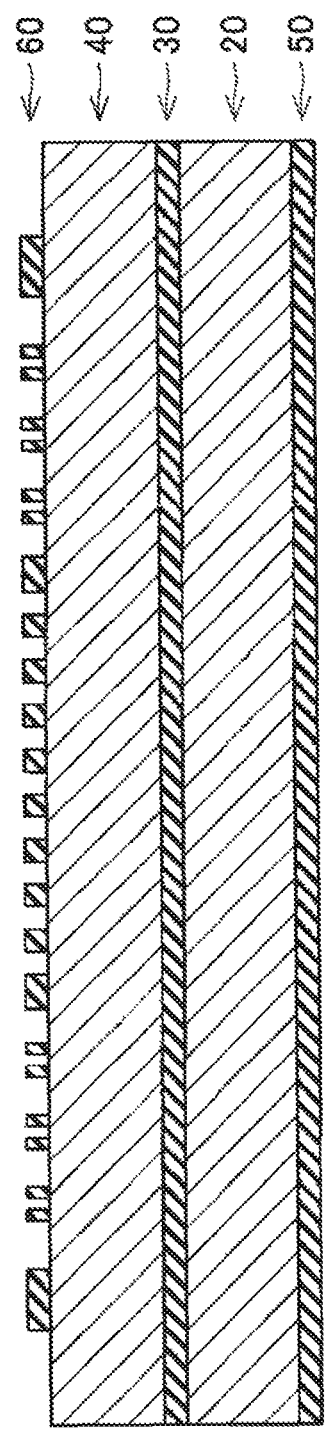
FIG. 9 shows a process to manufacture the accelerometer 10 in Example 1.

Next, as shown in FIG. 9, an oxide film RIE method is used to pattern the fourth layer 60, after which the resist 70 is removed. As a result a pattern similar to that of the resist 70 is formed in the fourth layer 60, and the shapes of the third layer 40 in the accelerometer 10 are transferred to the fourth layer 60. The fourth layer 60 functions as a mask in trench formation using a deep RIE method, described below.

Figure 10:
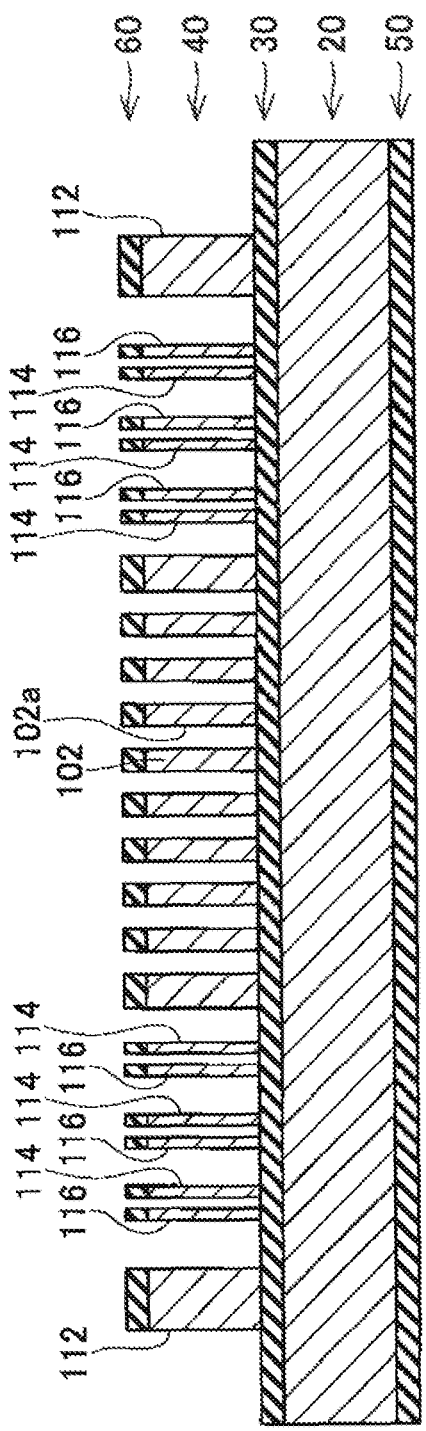
FIG. 10 shows a process to manufacture the accelerometer 10 in Example 1.

Next, as shown in FIG. 10, a deep RIE method is used to form trenches in the third layer 40. As a result, the proof mass 102, support beams 104, support portions 106, fixed electrode support portion 112, fixed electrodes 114, movable electrode support portion 115, and movable electrodes 116 are formed in the third layer 40 respectively. As shown in FIG. 4, in the accelerometer 10 of this example, compensation patterns 114a are formed at the tip portions of the fixed electrodes 114, compensation patterns 116a are formed at the tip portions of the movable electrodes 116, and so a shape results which suppresses sudden changes in trench width in the third layer 40. Hence as shown in FIG. 10, when forming trenches in the third layer 40 using the deep RIE method, there is no occurrence of silicon residue.

Figure 11:
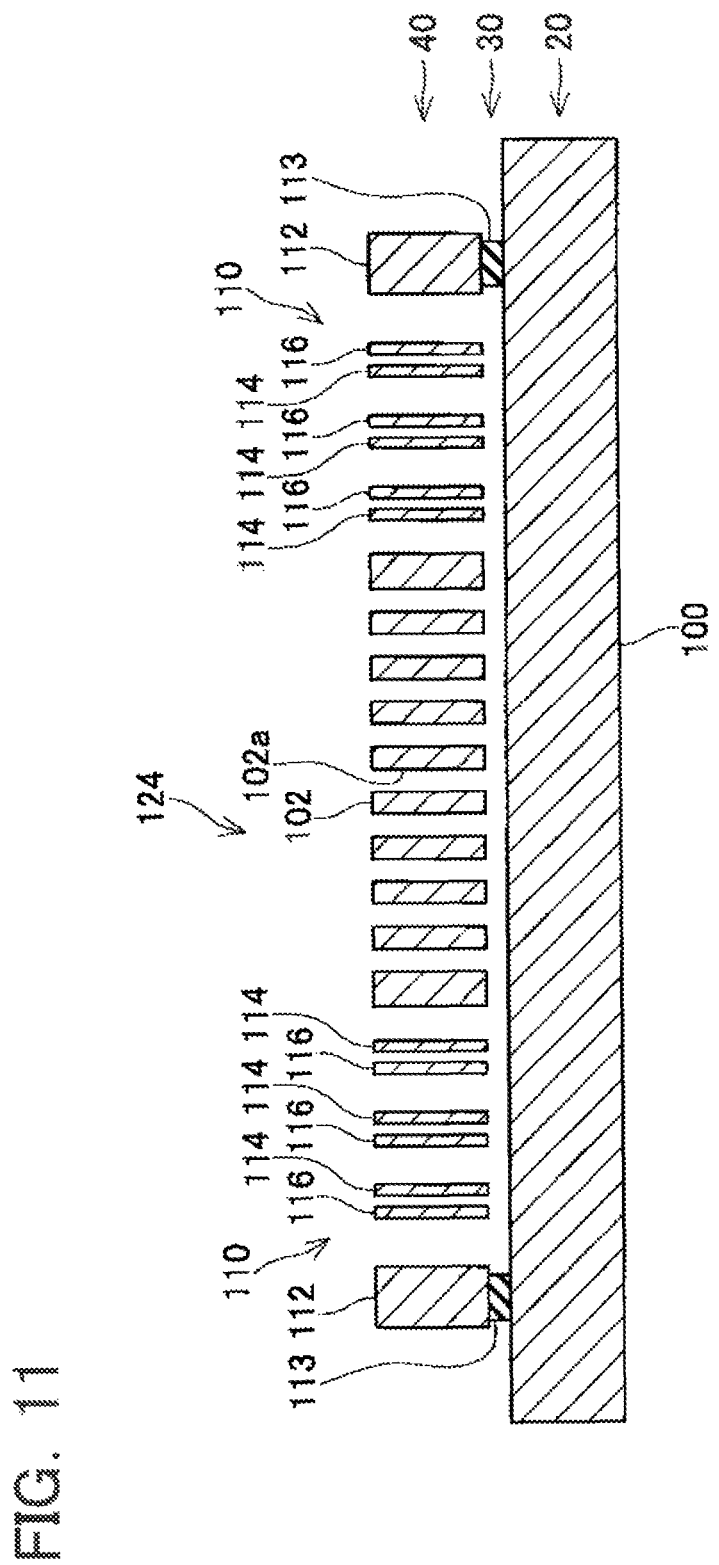
FIG. 11 shows a process to manufacture the accelerometer 10 in Example 1.

Next, as shown in FIG. 11, the silicon oxide of the second layer 30, which is a sacrificial layer, is selectively removed by etching using hydrofluoric acid. As a result, the second layer 30 is removed except for the portions which are the insulating, support portion 108 and the insulating support portion 113. Through this etching process, the fourth layer 60 and protective layer 50 are also removed. By the above processes, the accelerometer 10 shown in FIG. 1 to FIG. 3 can be manufactured.

Modified Example of the Accelerometer 10 of Example 1

Figure 12:
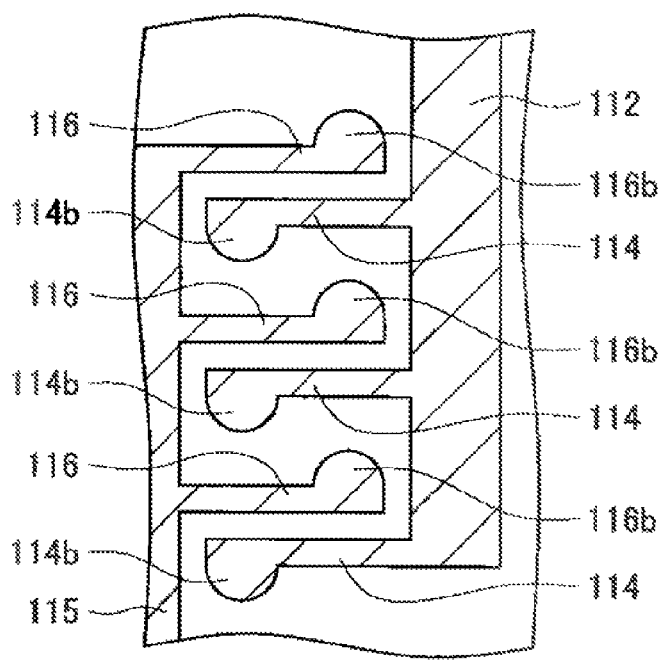
FIG. 12 shows a modified example of the X-direction detection portion 110 of the accelerometer 10 in Example 1.
Figure 13:
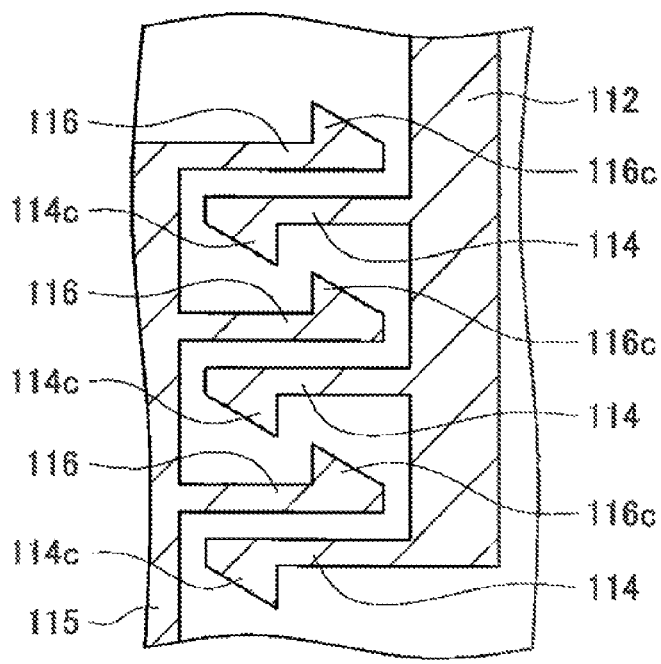
FIG. 13 shows another modified example of the X-direction detection portion 110 of the accelerometer 10 in Example 1.

The shapes of the compensation patterns used to compensate for sudden changes in trench width are not limited to the shapes of the above-described compensation patterns 114a and 116a. For example, as shown in FIG. 12, semicircular-shaped compensation patterns 114b and 116b may be formed at the tip portions of the fixed electrodes 114 and movable electrodes 116. Or, as shown in FIG. 13, triangular-shaped compensation patterns 114c and 116c may be formed at the tip portions of the fixed electrodes 114 and movable electrodes 116. When these configurations are employed as well, sudden changes in trench width in proximity to the tip portions of the fixed electrodes 114 and movable electrodes 116 are suppressed, and the occurrence of silicon residue can be prevented.

Figure 14:
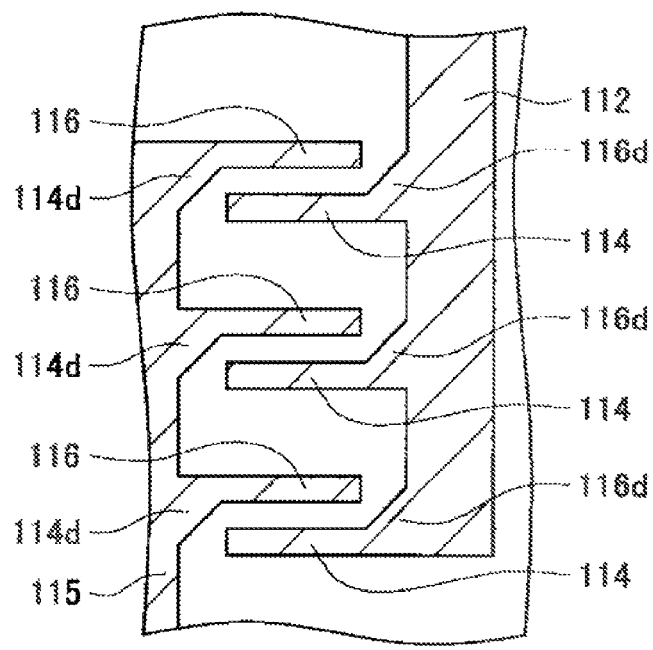
FIG. 14 shows another modified example of the X-direction detection portion 110 of the accelerometer 10 in Example 1.
Figure 15:
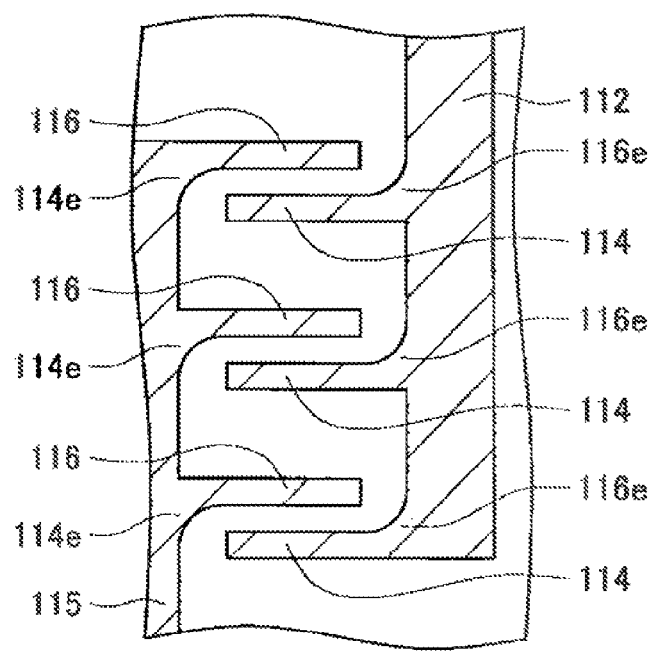
FIG. 15 shows another modified example of the X-direction detection portion 110 of the accelerometer 10 in Example 1.
Figure 16:
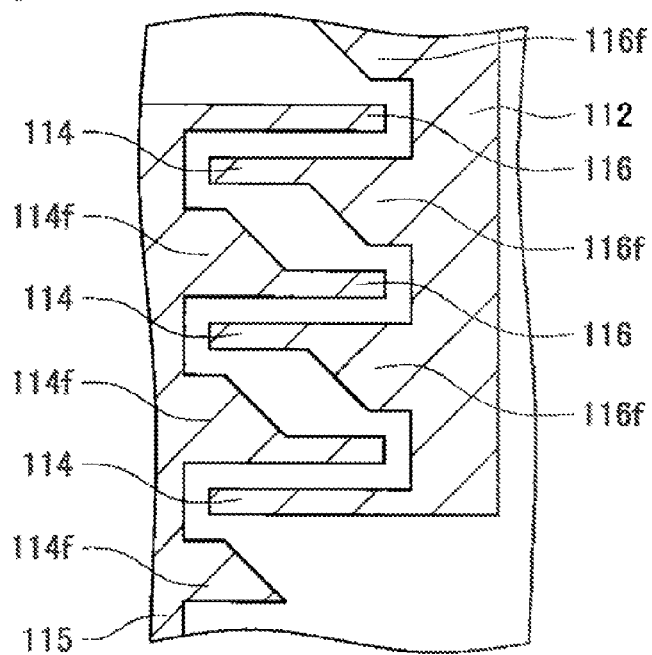
FIG. 16 shows another modified example of the X-direction detection portion 110 of the accelerometer 10 in Example 1.
Figure 17:
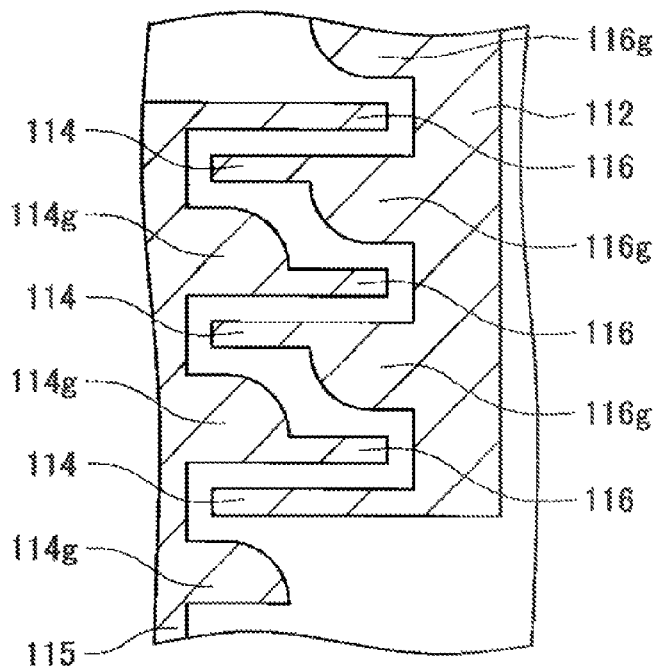
FIG. 17 shows another modified example of the X-direction detection portion 110 of the accelerometer 10 in Example 1.

Further, compensation patterns to compensate for sudden changes in trench width may be formed at places opposing the tip portions of the fixed electrodes 114 and movable electrodes 116, rather than at the tip portions of the fixed electrodes 114 and movable electrodes 116. For example, as shown in FIG. 14, triangular-shaped compensation patterns 114d may be formed at corner portions of the movable electrodes 116 disposed in proximity to the tip portions of the fixed electrodes 114 and the movable electrode support portion 115, and triangular-shaped compensation patterns 116d may be formed at corner portions of the fixed electrodes 114 disposed in proximity to the tip portions of the movable electrodes 116 and the fixed electrode support portion 112. Or, as shown in FIG. 15, concave-shape compensation patterns 114e may be formed at corner portions of the movable electrodes 116 disposed in proximity to the tip portions of the fixed electrodes 114 and the movable electrode support portion 115, and concave-shape compensation patterns 116e may be formed at corner portions of the fixed electrodes 114 disposed in proximity to the tip portions of the movable electrodes 116 and the fixed electrode support portion 112. Or, as shown in FIG. 16, compensation patterns 114f having a triangular-shaped portion may be formed at corners of the movable electrodes 116 disposed remotely from the tip portions of the fixed electrodes 114 and the movable electrode support portion 115, and compensation portions 116f having triangular-shaped portions may be formed at corner portions of the fixed electrodes 114 disposed remotely from the tip portions of movable electrodes 116 and the fixed electrode support portion 112. Or, as shown in FIG. 17, compensation patterns 114g having semicircular-shaped portions may be formed at corner portions of the movable electrodes 116 disposed remotely from the tip portions of the fixed electrodes 114 and the movable electrode support portion 115, and compensation patterns 116g having semicircular-shaped portions may be formed at corner portions of the fixed electrodes 114 disposed remotely from the tip portions of the movable electrodes 116 and the fixed electrode support portion 112. In the cases of these configurations also, sudden changes in trench width in proximity to the tip portions of the fixed electrodes 114 and the movable electrodes 116 can be suppressed, and the occurrence of silicon residue can be prevented.

In the above, cases were explained in which the occurrence of silicon residue is prevented at fixed electrodes 114 the positions of which are fixed relative to a support substrate 100 and at movable electrodes 116 the positions of which are fixed relative to a proof mass 102 which is a movable structure. The invention of the present application is not limited to the above-described configurations, and for example the movable structure may not comprise a proof mass 102, and a configuration may be employed in which the movable electrode support portion 115 is directly supported by the support beams 104 and support portions 106.

Further, the invention of the present application is not limited to a semiconductor device comprising a support substrate and a movable structure as described above, but can be applied to any kind of semiconductor device, so long as a trench of narrow width is formed in a thick semiconductor layer in the semiconductor device.

Figure 31:
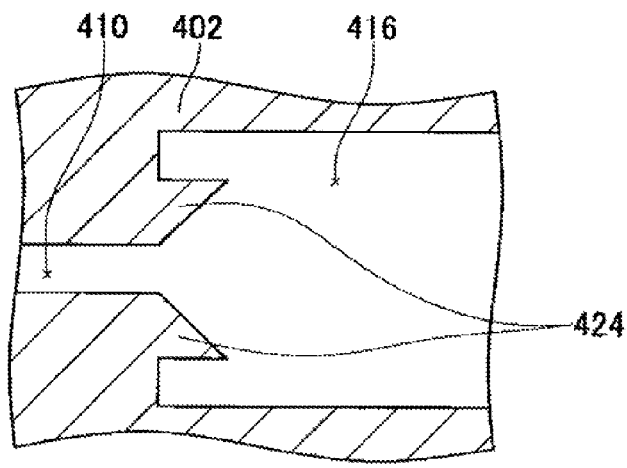
FIG. 31 shows a modified example of the invention of the present application.
Figure 32:
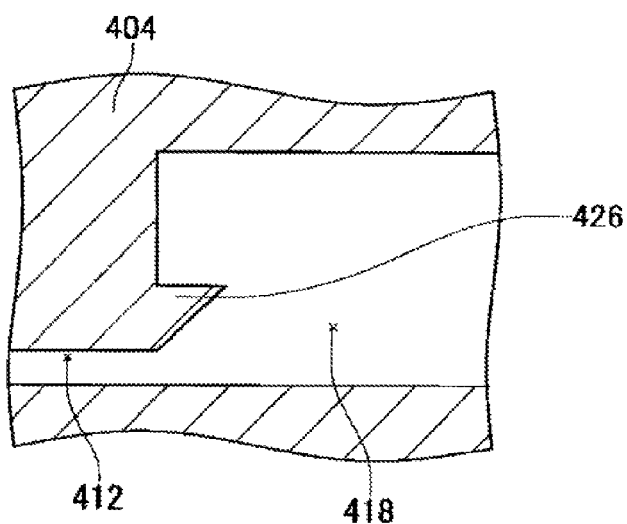
FIG. 32 shows another modified example of the invention of the present application.
Figure 33:
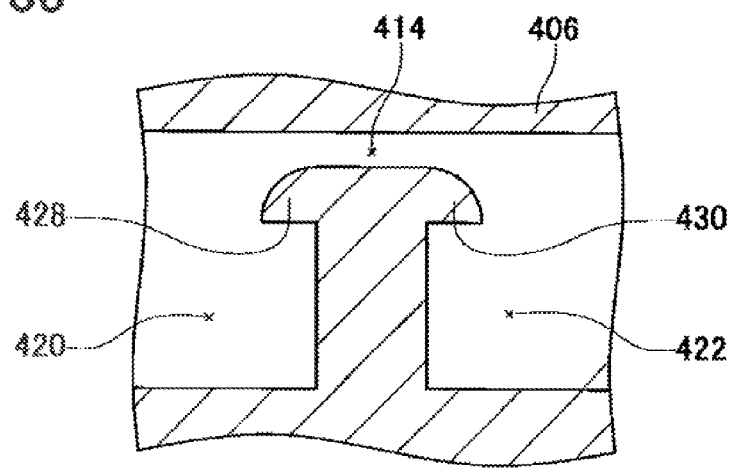
FIG. 33 shows another modified example of the invention of the present application.

For example, as shown in FIG. 31 to FIG. 33, when forming patterns in thick semiconductor layers 402, 404 and 406 in which narrow trenches 410, 412 and 414 and wide trenches 416, 418, 420 and 422 are connected, by forming the compensation patterns 424, 426, 428 and 430, sudden changes in trench width are compensated.

Example 2

Below, the structure of the angular velocity sensor 90 of Example 2 is explained, referring to FIG. 34 to FIG. 36. Similarly to the accelerometer 10 of Example 1, the angular velocity sensor 90 of this example has a stacked structure of a first layer 20 consisting of a conductor, a second layer 30 consisting of an insulator, and a third layer 40 consisting of a conductor.

Figure 34:
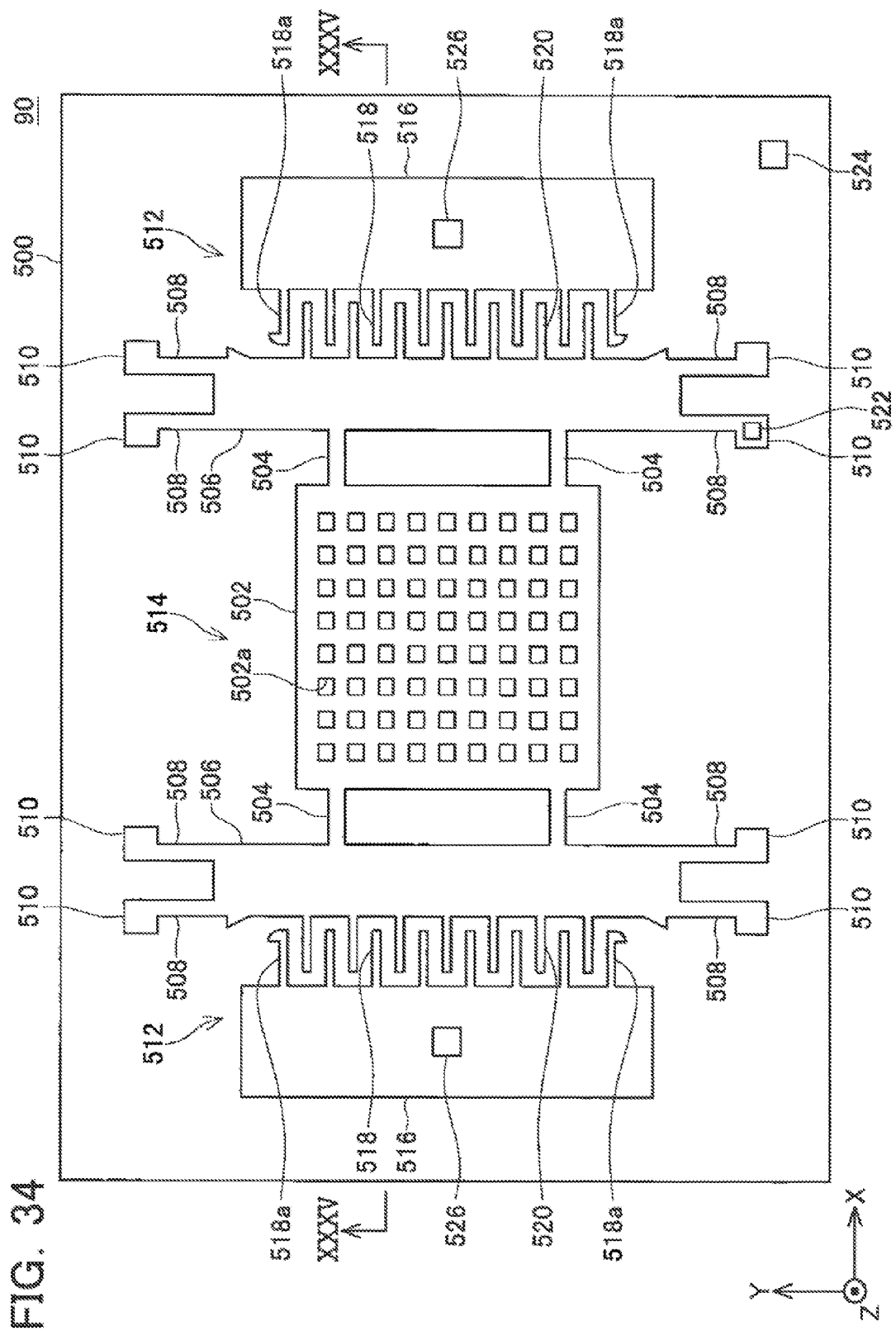
FIG. 34 shows a plane view of the angular velocity sensor 90 of Example 2.
Figure 35:
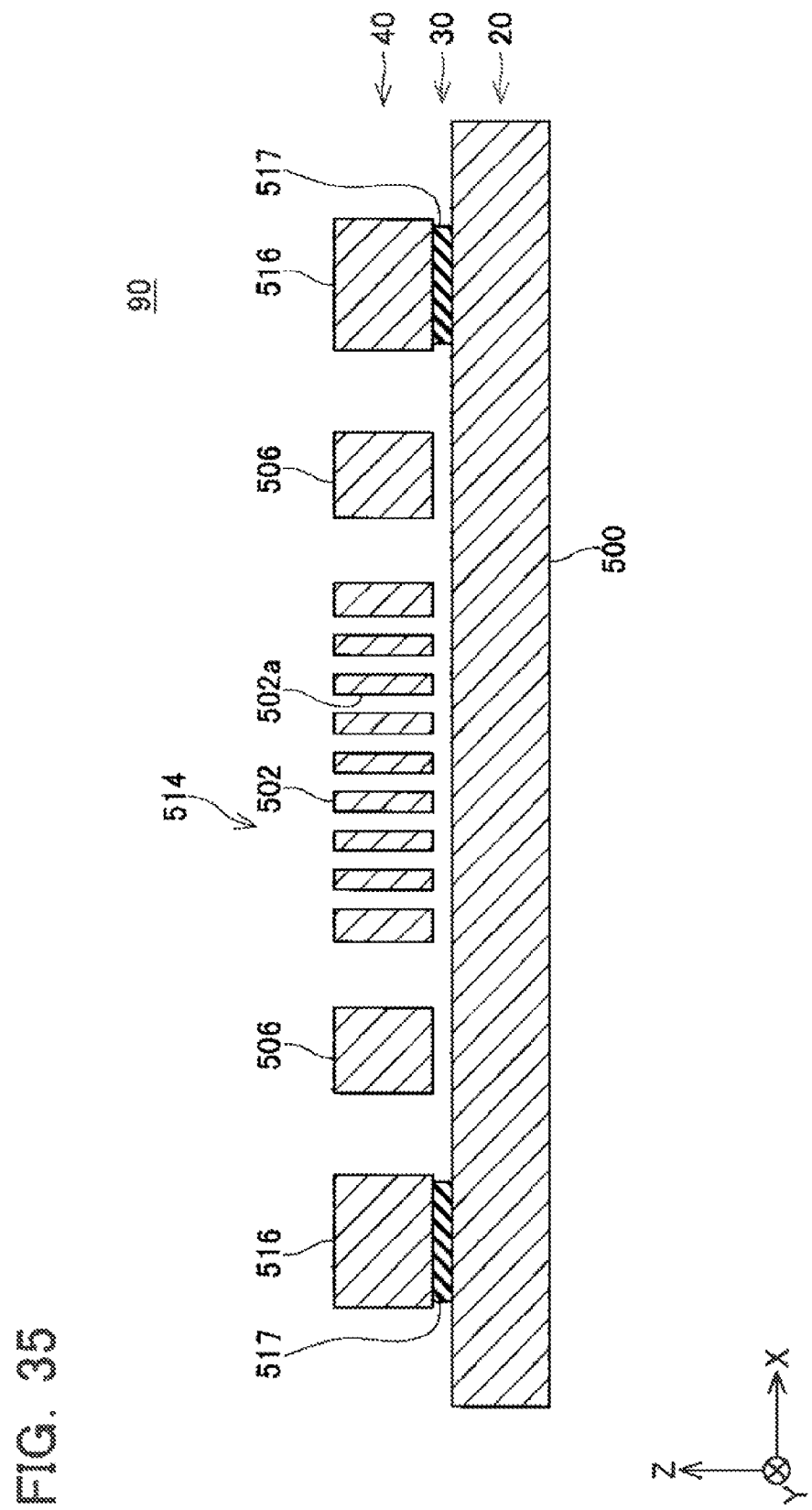
FIG. 35 shows a longitudinal cross-sectional view of the cross-section XXXV-XXXV in FIG. 34 of the angular velocity sensor 90 in Example 2.
Figure 36:
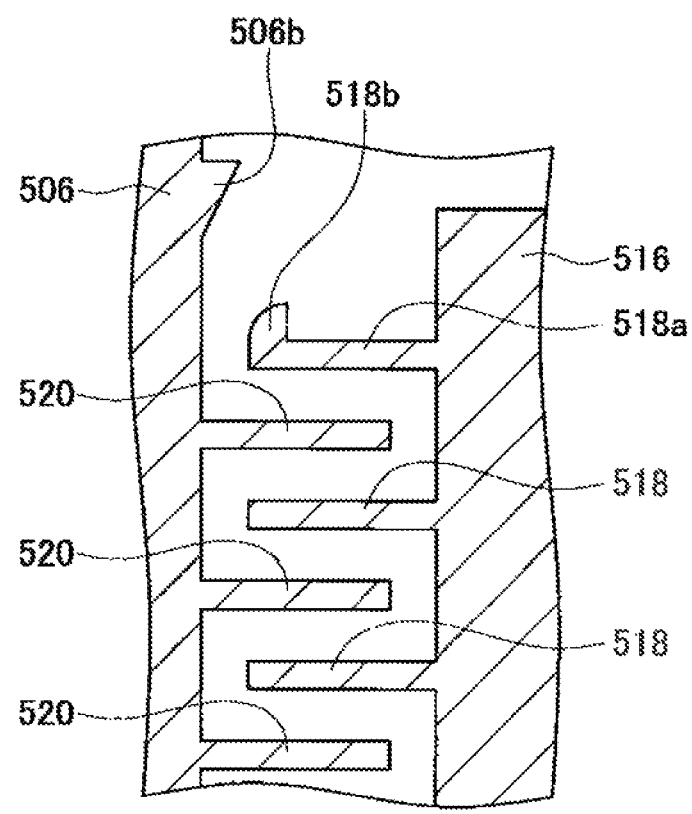
FIG. 36 shows a partial enlarged view of the proximity of the tip portion of the fixed electrode 518a on the outermost side of the angular velocity sensor 90 in Example 2.

As shown in FIG. 34 and FIG. 35, the angular velocity sensor 90 comprises a support substrate 500, a proof mass 502, first support beams 504, movable electrode support portions 506, second support beams 508, and support portions 510. The support substrate 500 is formed in the first layer 20. The proof mass 502, first support beams 504, movable electrode support portions 506, second support beams 508 and support portions 510 are formed in the third layer 40. The support portions 510 are fixed relative to the support substrate 500 via insulating support portions formed in the second layer 30. The second support beams 508 connect the support portions 510 and the movable electrode support portions 506. The second support beams 508 are formed in long narrow shapes such that bending stiffness and shear stiffness in the X direction are low. The first support beams 504 connect the movable electrode support portions 506 and the proof mass 502. The first support beams 504 are formed in long narrow shapes such that bending stiffness and shear stiffness in the Z direction are low. The proof mass 502 is formed in a flat rectangular shape. Numerous holes 502a for sacrificial layer etching are formed in the proof mass 502. The proof mass 502 is supported so as to be separated by a gap from the support substrate 500, and so as to be substantially parallel to the support substrate 500. The proof mass 502 can be displaced relative to the support substrate 500 in the X and Z directions.

For example, when a force in the Z direction acts on the proof mass 502, the first support beams 504 bend in the Z direction, and the proof mass 502 is displaced in the Z direction relative to the support substrate 500. At this time the amount of deflection of the first support beams 504 corresponds to the magnitude of the force acting on the proof mass 502. Hence by detecting the amount of displacement in the Z direction of the proof mass 502 relative to the support substrate 500, the Z-direction force acting on the proof mass 502 can be detected.

The angular velocity sensor 90 comprises X-direction driving portions 512 and a Z-direction detection portion 514. The X-direction driving portions 512 comprise fixed electrode support portions 516, comb-shaped fixed electrodes 51$ extending from the fixed electrode support portions 516, and comb-shaped movable electrodes 520 extending from the movable electrode support portions 506. The fixed electrode support portions 516, fixed electrodes 518 and movable electrodes 520 are formed in the third layer 40. The fixed electrode support portions 516 are fixed relative to the support substrate 500 via insulating support portions 517 formed in the second layer 30. The fixed electrodes 518 and movable electrodes 520 are disposed so as to be mutually opposed in the Y direction. In this example, the distance between mutually adjacent fixed electrodes 518 and movable electrodes 520 is approximately 10 µm to 20 µm. When a driving voltage is applied across the fixed electrodes 518 and movable electrodes 520, a force acts to draw together the movable electrode support portions 506 and the fixed electrode support portions 516 so as to increase the opposing area of the fixed electrodes 518 and movable electrodes 520. Hence by repeating in alternation application of a driving voltage to one of the X-direction driving portions 512 (for example the X-direction driving portion 512 on the left side in FIG. 34) and application of a driving voltage to the other X-direction driving portion 512 (for example the X-direction driving portion 512 on the right side in FIG. 34), to periodic force in the X-direction acts on the proof mass 502, and the proof mass 502 can be made to vibrate in the X direction. That is, the X-direction driving portions 512 can be called a comb drive-type electrostatic actuator. In a state in which the proof mass 502 is vibrating in the X direction, when an angular velocity acts about the Y axis on the angular velocity sensor 90, a Coriolis force in the Z direction acts on the proof mass 502. The magnitude of the Coriolis force is proportional to the magnitude of the angular velocity, and thus by detecting the amount of displacement in the Z direction of the proof mass 502 relative to the support substrate 500, the angular velocity about the Y axis acting on the angular velocity sensor 90 can be detected.

The Z-direction detection portion 514 comprises the support substrate 500 serving as a fixed electrode, and the proof mass 502 serving as a movable electrode. An electrostatic capacitance is formed between the support substrate 500 and the proof mass 502, corresponding to the opposing area and distance between the two. When the proof mass 502 is displaced in the Z direction relative to the support substrate 500, the magnitude of the electrostatic capacitance between the support substrate 500 and the proof mass 502 changes. By detecting this change in the electrostatic capacitance, the amount of displacement in the Z direction of the proof mass 502 relative to the support substrate 500 can be detected.

In the angular velocity sensor 90 of this example, the proof mass 502, first support beams 504, movable electrode support portions 506, movable electrodes 520, second support beams 508, and support portions 510 are formed seamlessly and integrally. Hence the proof mass 502, first support beams 504, movable electrode support portions 506, movable electrodes 520, second support beams 508, and support portions 510 are maintained at the same electrical potential. Further, in the angular velocity sensor 90 of this example, the fixed electrode support portions 516 and fixed electrodes 518 are formed seamlessly and integrally, and are maintained at the same electrical potential. The proof mass 502, first support beams 504, movable electrode support portions 506, movable electrodes 520, second support beams 508, support portions 510, fixed electrode support portions 516, and fixed electrodes 518 are formed by forming trenches in the third layer 40.

The angular velocity sensor 90 comprises a first surface electrode 522 which conducts with the support portions 510 (that is, conducts with the proof mass 502 which is the movable electrode of the Z-direction detection portion 514, and conducts with the movable electrodes 520 of the X-direction driving portion 512), a second surface electrode 524 which conducts with the support substrate 500 (that is, conducts with the fixed electrodes of the Z-direction detection portion 514), and third surface electrodes 526 which conduct with the fixed electrode support portions 516 (that is, conduct with the fixed electrodes 518 of the X-direction driving portions 512). By using the second surface electrode 524 and third surface electrodes 526 to apply a driving voltage to the X-direction driving portions 512, and using the first surface electrode 522 and second surface electrode 524 to acquire the output of the Z-direction detection portion 514, and by performing computation processing using a computation circuit (not shown), the angular velocity about the Y axis acting on the angular velocity sensor 90 can be detected.

In the angular velocity sensor 90 of this example, the fixed electrodes 518 and the movable electrodes 520 are adjacent at substantially constant intervals. Hence by making the intervals between the tip portions of the fixed electrodes 520 and the movable electrode support portions 516 as well as the tip portions of the movable electrodes 520 and the fixed electrode support portions 516 coincide with the intervals between the mutually adjacent fixed electrodes 518 and movable electrodes 520, trench widths can be made substantially constant, and the occurrence of silicon residue can be prevented. However, even when such a configuration is employed, in proximity to the tip portions of the fixed electrodes 518a positioned on the outermost sides, a sudden change occurs in the trench width. Hence as shown in FIG. 36, in the angular velocity sensor 90 compensation patterns 518b are formed at the tip portions of the fixed electrodes 518a positioned on the outermost sides. Further, compensation patterns 506b are formed at places opposing the tip portions of the fixed electrodes 518a at which the compensation patterns 518b are formed. By thus forming the compensation patterns 518b and the compensation patterns 506b, sudden changes in trench width in proximity to the tip portions of the fixed electrodes 518a can be suppressed, and the occurrence of silicon residue can be prevented.

The representative and non-limiting specific embodiments of the present invention are described above in detail with reference to the drawings. The detailed description provided above is simply intended to provide those skilled in the art with the detail for implementing preferred examples of the present invention and is not intended to limit the scope of the present invention. Additional characteristics and inventions disclosed herein can be used independently of, or along with, other characteristics and inventions in order to provide a further improved semiconductor device.

The combinations of the characteristics and steps disclosed in the detailed description above are not essential for implementing the present invention in the broadest sense and are merely provided in order to explain particularly the representative specific embodiments of the present invention. In addition, various characteristics of the representative specific embodiments described above and various characteristics described in the independent and dependent claims do not have to be combined in accordance with the embodiments described herein or in any particular order when providing additional and useful embodiments of the present invention.

All the characteristics described in the present description and/or the claims are intended to be disclosed separately and independently from each other for the purpose of original disclosure, as well as for the purpose of restricting the claimed subject matters independent of the compositions of the characteristics described in the embodiments and/or the claims. In addition, all value ranges or indications of groups of entities are intended to disclose every possible intermediate value or intermediate entity for the purpose of original disclosure, as well as for the purpose of restricting the claimed subject matters.

The embodiments of the present invention are described above in detail. However, these embodiments are merely illustrative and are not intended to limit the scope of patent claims. The technology described in the scope of patent claims includes various changes and modifications of the specific embodiments illustrated above. The technical elements exemplified in the present description or the drawings exert technical utility independently or in various combinations, and are not limited to the combinations of the claims described in the application originally filed. Further, the technology exemplified in the present description or the drawings simultaneously achieve a plurality of objects, and achieving one of the objects itself has technical utility.

What is claimed is:

1. A semiconductor device, comprising a semiconductor layer having a first trench having a first width and a second trench having a second width different from the first width and connected with the first trench, wherein
a compensation pattern for gradually compensating a difference between the first width and the second width, is formed at a place of contact between the first trench and the second trench.

2. The semiconductor device according to claim 1, comprising a tip portion interposed between the first trench and the second trench, wherein the first trench contacts the second trench in the proximity of the tip portion, and the compensation pattern is formed at the tip portion.

3. The semiconductor device according to claim 2, comprising:
a support substrate;
a movable structure;
a comb-shaped fixed electrode in a fixed position relative to the support substrate, and
a comb-shaped movable electrode in a fixed position relative to the movable structure, wherein
the fixed electrode and the movable electrode are disposed to face each other, and
the tip portion is a tip portion of the fixed electrode or a tip portion of the movable electrode.

4. The semiconductor device according to claim 3, wherein a thickness of the semiconductor layer is 200 μm or greater, and a ratio of depth thereof to a width of the first trench or the second trench is 20 or greater.

5. The semiconductor device according to claim 2, wherein a thickness of the semiconductor layer is 200 μm or greater, and a ratio of depth thereof to a width of the first trench or the second trench is 20 or greater.

6. The semiconductor device according to claim 1, comprising a tip portion interposed between the first trench and the second trench, wherein the first trench contacts the second trench in the proximity of the tip portion, and the compensation pattern is formed at a place opposing the tip portion.

7. The semiconductor device according to claim 6, comprising:
a support substrate;
a movable structure;
a comb-shaped fixed electrode in a fixed position relative to the support substrate, and
a comb-shaped movable electrode in a fixed position relative to the movable structure, wherein
the fixed electrode and the movable electrode are disposed to face each other, and
the tip portion is a tip portion of the fixed electrode or a tip portion of the movable electrode.

8. The semiconductor device according to claim 7, wherein a thickness of the semiconductor layer is 200 μm or greater, and a ratio of depth thereof to a width of the first trench or the second trench is 20 or greater.

9. The semiconductor device according to claim 6, wherein a thickness of the semiconductor layer is 200 μm or greater, and a ratio of depth thereof to a width of the first trench or the second trench is 20 or greater.

10. The semiconductor device according to claim 1, wherein a thickness of the semiconductor layer is 200 μm or greater, and a ratio of depth thereof to a width of the first trench or the second trench is 20 or greater.

* * * * *